United States Patent
Wu et al.

(10) Patent No.: US 10,338,156 B2
(45) Date of Patent: Jul. 2, 2019

(54) APPARATUS AND SYSTEM FOR AN ULTRA SENSITIVITY MAGNETO-OPTIC SENSOR FOR HIGH SENSITIVITY MAGNETIC FIELD DETECTION AND MEASUREMENTS

(71) Applicant: The United States of America, as represented by the Secretary of the Navy, Washington, DC (US)

(72) Inventors: Dong Ho Wu, Olney, MD (US); Anthony Garzarella, Ellicott City, MD (US)

(73) Assignee: The United States of America, as represented by the Secretary of the Navy, Washington, DC (US)

( * ) Notice: Subject to any disclaimer, the term of this patent is extended or adjusted under 35 U.S.C. 154(b) by 161 days.

(21) Appl. No.: 15/170,569

(22) Filed: Jun. 1, 2016

(65) Prior Publication Data

US 2017/0176548 A1 Jun. 22, 2017

Related U.S. Application Data

(60) Provisional application No. 62/270,871, filed on Dec. 22, 2015.

(51) Int. Cl.
*G01R 33/02* (2006.01)
*G01R 33/032* (2006.01)

(52) U.S. Cl.
CPC .................. *G01R 33/032* (2013.01)

(58) Field of Classification Search
CPC ............... G01R 33/032; G01R 33/323; G01R 33/0327; G01R 31/311; G01R 31/308; G01R 29/14
See application file for complete search history.

(56) References Cited

U.S. PATENT DOCUMENTS

| | | | | |
|---|---|---|---|---|
| 4,973,899 | A * | 11/1990 | Jones | G01R 15/246 250/225 |
| 5,483,161 | A * | 1/1996 | Deeter | G01R 33/0322 250/225 |
| 6,952,107 | B2 * | 10/2005 | Rahmatian | G01R 15/241 324/96 |
| 8,358,415 | B2 * | 1/2013 | Wu | G01R 31/308 324/96 |
| 2013/0038324 | A1 * | 2/2013 | Wu | G01R 33/032 324/244.1 |

* cited by examiner

*Primary Examiner* — Minh N Tang
(74) *Attorney, Agent, or Firm* — US Naval Research Laboratory; Richard F. Bis

(57) ABSTRACT

An ultra-sensitivity optical-fiber magneto-optic field sensor includes an input fiber passing optical power from an optical source into the sensor; a polarizer optically coupled to and downstream of the input fiber; an analyzer optically coupled to and downstream of the polarizer; an output fiber passing optical power out of the sensor to a photoreceiver; and a magneto-optic crystal element optically coupled between the polarizer and the analyzer. The ultra-sensitivity optical-fiber magneto-optic field sensor has an optical axis extending between the input and output fibers along which a beam of optical power is transmitted.

17 Claims, 24 Drawing Sheets

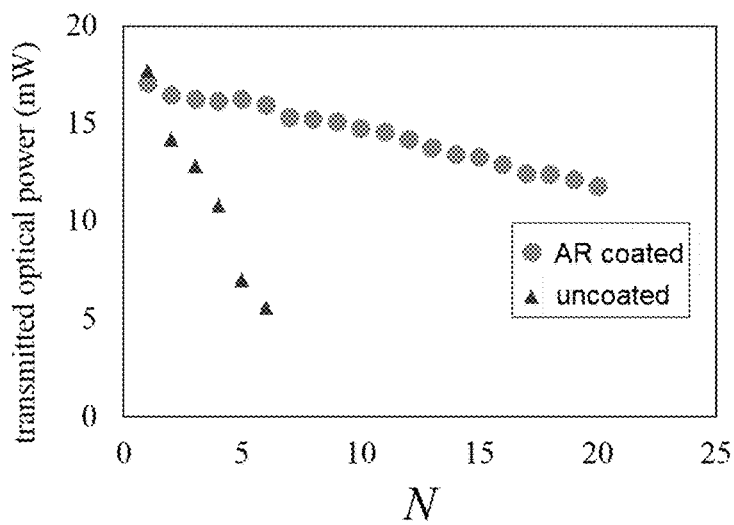
FIG. 20
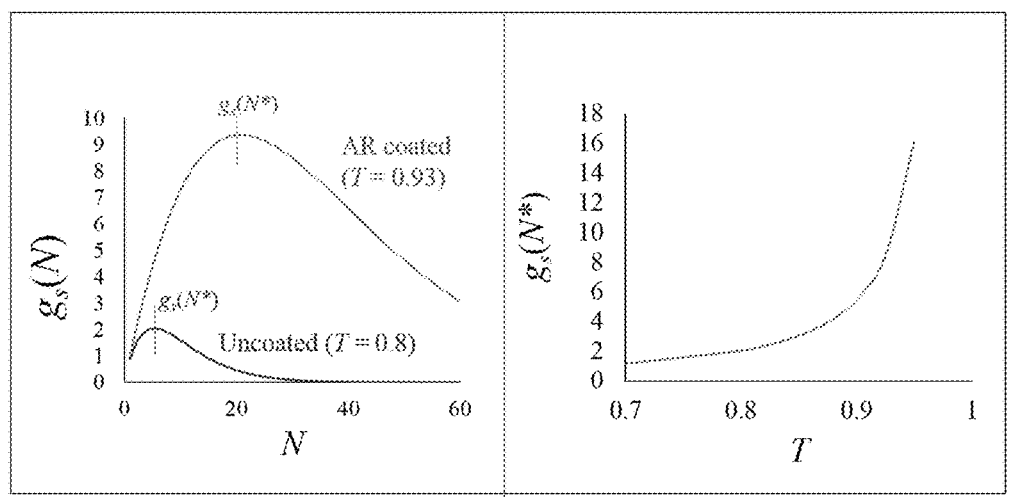
FIG. 21       FIG. 22

APPARATUS AND SYSTEM FOR AN ULTRA SENSITIVITY MAGNETO-OPTIC SENSOR FOR HIGH SENSITIVITY MAGNETIC FIELD DETECTION AND MEASUREMENTS

RELATED APPLICATIONS

This application claims the benefit of U.S. Provisional Application No. 62/270,871 filed Dec. 22, 2015, which is hereby incorporated herein by reference.

FIELD OF INVENTION

The present invention relates generally to magnetic sensing, and more particularly to an ultra-sensitivity optical-fiber magneto-optic (MO) field sensor.

BACKGROUND

Presently, B-dot sensors are widely used for high-power microwave (HPM) test and evaluation. They are, in general, composed of a metallic loop antenna or coil that interacts with the electromagnetic field; the metal in the antenna or coil results in unacceptably large field perturbations. As a consequence, the magnetic field measured by the B-dot sensor is not a true field, and it is often difficult or impossible to obtain reliable HPM test and evaluation (T&E) results with such B-dot sensors, particularly in confined spaces. In addition, B-dot sensors have a narrow bandwidth. To perform HPM T&E over a broad frequency bandwidth, several different B-dot sensors with complementary bandwidths are required. Thirdly, the signal produced by the B-dot depends on the time derivative of the HPM signal. Consequently low sensitivities are obtained at the crests and troughs of the waveform, while higher sensitivities are obtained in the regions in between. Finally, because the B-dot sensor measures time derivative, additional signal processing is necessary to obtain the amplitude and waveform of the external field.

The Hall probe is a convenient magnetic field sensor, used at room temperature. However, its sensitivity is several orders of magnitude poorer than that of the SQUID or atomic vapor cell. In addition, it has a narrow dynamic range and a very limited frequency bandwidth (DC-kHz).

Superconducting quantum-interference devices (SQUIDs) are the most sensitive magnetometers that are commercially available. The operating bandwidth of SQUIDs is typically from DC to a few GHz. However, SQUIDs must be operated at cryogenic temperatures, which are typically at or below −269° C. This requires that the SQUID be kept inside a cryogenic Dewar; thus an operational SQUID is very large, bulky, and has limited portability. The SQUID also contains metallic and superconducting components, which can interfere with the measurement of the electromagnetic field.

Atomic vapor cells are very sensitive magnetic field sensors, currently being developed by several research groups. A few of these groups have already demonstrated atomic vapor cells that have sensitivities exceeding those of SQUIDs. An atomic vapor cell requires an oven, which must keep the cell at a constant temperature, in order to produce atomic vapor. Although a state-of-the art atomic vapor cell uses a small oven, contained within the vapor cell device, vapor cells can only be used in limited applications, namely, those that do not alter the oven temperature.

SUMMARY OF INVENTION

According to one aspect of the invention, an ultra-sensitivity optical-fiber magneto-optic field sensor includes an input fiber passing optical power from an optical source into the sensor; a polarizer optically coupled to and downstream of the input fiber; an analyzer optically coupled to and downstream of the polarizer; an output fiber passing optical power out of the sensor to a photoreceiver; and a magneto-optic crystal element optically coupled between the polarizer and the analyzer. The ultra-sensitivity optical-fiber magneto-optic field sensor has an optical axis extending between the input and output fibers along which a beam of optical power is transmitted.

Optionally, the ultra-sensitivity optical-fiber magneto-optic field sensor includes a first flux concentrator optically coupled to and between the polarizer and the magneto-optic crystal element; and a second flux concentrator optically coupled to and between the magneto-optic crystal element and the analyzer.

Optionally, the flux concentrators are hollow cylindrical tubes.

Optionally, the flux concentrators are hollow conical tubes.

Optionally, each flux concentrator is placed in contact with respective ends of the magneto-optic crystal element.

Optionally, each flux concentrator has a ratio of length to minimum diameter of about 40:1.

Optionally, the ultra-sensitivity optical-fiber magneto-optic field sensor includes a second magneto-optic crystal element optically coupled between the other magneto-optic crystal element and the analyzer; a first flux concentrator optically coupled to and between the polarizer and the other magneto-optic crystal element; a second flux concentrator optically coupled to and between the second magneto-optic crystal element and the analyzer; and a third flux concentrator optically coupled to and between the other and second magneto-optic crystal elements.

Optionally, the magneto-optic crystal element is a stack of crystals having a planar anisotropy.

Optionally, the magneto-optic crystal element is a stack of crystals skewed to the optical axis.

Optionally, the stack of crystals has a tilt angle of between 1 and 5 degrees from being perpendicular to the optical axis.

Optionally, the ultra-sensitivity optical-fiber magneto-optic field sensor includes a first flux concentrator optically coupled to and between the polarizer and the magneto-optic crystal element, and having an end formed at a tilt angle matching the tilt angle of the magneto-optic crystal element, and wherein the end of the first flux concentrator is in physical contact with an adjacent end of the magneto-optic crystal element; and a second flux concentrator optically coupled to and between the magneto-optic crystal element and the analyzer, and having an end formed at a tilt angle matching the tilt angle of the magneto-optic crystal element, and wherein the end of the second flux concentrator is in physical contact with an adjacent end of the magneto-optic crystal element.

Optionally, each crystal in the stack of crystals are in physical contact with any adjacent crystals, and wherein each crystal in the stack of crystals contains matching domain patterns with each adjacent crystal.

Optionally, each crystal in the stack of crystals is coated with anti-reflective coating.

Optionally, an angular orientation of the analyzer about the optical axis is rotated with respect to the polarizer at an angle $\theta_p^*$, wherein $$\theta_p^* = \cos^{-1}\sqrt{1/(2+P_0 c_1/c_0)},$$

and wherein $P_0$ is the optical power passing through the magneto-optic crystal element, and wherein $c_0$ and $c_1$ are constants that depend on the noise characteristics of the photoreceiver and source of the optical power.

Optionally, an angular orientation of the analyzer about the optical axis is rotated with respect to the polarizer at an angle of between 70° and 80°.

Optionally, the ultra-sensitivity optical-fiber magneto-optic field sensor includes a pump coil configured to selectively prime the crystal element into operating at a Barkhausen step of higher slope relative to an unprimed state of the crystal element.

Optionally, the ultra-sensitivity optical-fiber magneto-optic field sensor includes a removable high sensitivity module.

Optionally, the removable high sensitivity module includes the flux concentrators.

Optionally, the high sensitivity module includes the pump coil.

Optionally, the ultra-sensitivity optical-fiber magneto-optic field sensor includes a collimating lens optically coupled between the input fiber and the polarizer.

Optionally, the input fiber is a polarization maintaining fiber.

Optionally, the output fiber is a multimode fiber.

Optionally, the transmission axis of the input polarizer is aligned with the direction of laser polarization exiting the input fiber.

According to another aspect of the invention, a method of measuring a target magnetic field using an ultra-sensitivity optical-fiber magneto-optic field sensor includes priming the magneto-optic crystal element with a pump field to utilize a Barkhausen step of higher slope relative to an unprimed state of the crystal element; passing polarized optical power through a magneto-optic crystal element; and measuring change in polarization angle of the optical power after being passed through the crystal element.

The foregoing and other features of the invention are hereinafter described in greater detail with reference to the accompanying drawings.

BRIEF DESCRIPTION OF THE DRAWINGS

FIG. 20 shows transmitted optical power through a Bi:RIG array with versus without AR coating.

FIG. 21 shows stacking gain factor $g_s$ as a function of stacking number N. The peak value indicates the optimal number of crystals in the array.

FIG. 22 shows peak value of stacking gain factor versus transmissivity. The divergence near T=1 demonstrates the critical importance of good transmissivity.

DETAILED DESCRIPTION

An ultra sensitivity optical-fiber magneto-optic (MO) field sensor is described herein, which is able to measure a magnetic field with minimal perturbation to the field, and it can be used for various purposes. Some examples of its applications are: rail gun characterizations, high-power microwave (HPM) test and evaluation; diagnosis of radar and RF/microwave devices; detection/measurement of weak magnetic fields (e.g., magnetic resonance imaging); characterization of very intense magnetic fields (>100 Tesla); detection of very low-frequency magnetic fields; characterization of a magnetic field over an ultra-broad frequency band (DC-2 GHz); submarine detection; and submarine underwater communication.

Figure 1:
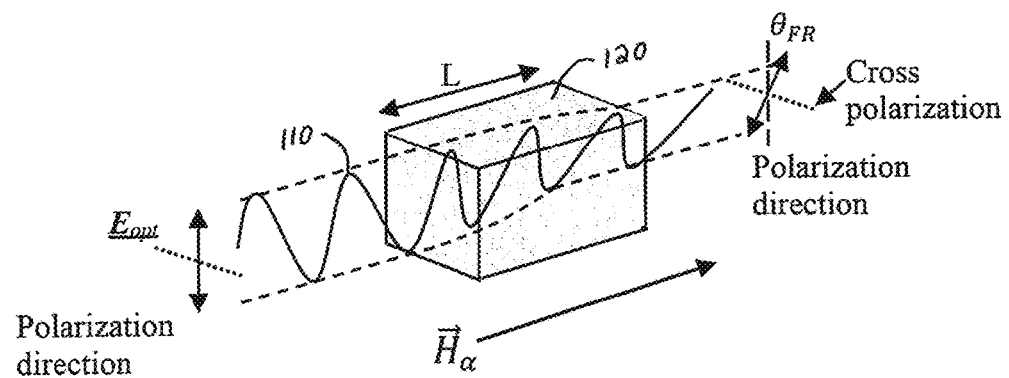
FIG. 1 shows an illustration of the Faraday Effect.

When a light beam 110 propagates through a magneto-optic medium 120 of length L, the application of an external magnetic field $\vec{H}$ causes a rotation $\theta_{FR}$ of the plane of polarization of the beam, as illustrated in FIG. 1. This is called the Faraday Effect, which can be expressed as $$\theta_{FR}=(\vec{\alpha}\cdot\vec{H})L, \quad (1)$$

Where $\vec{\alpha}$ is defined as the responsivity vector, whose magnitude determines sensitivity and whose direction determines the sensitivity axis. A magnetic field directed along $\vec{\alpha}$ yields the largest Faraday rotation while fields directed perpendicular to $\vec{\alpha}$ yield zero Faraday rotation. In paramagnetic MO crystals, the magnitude of $\vec{\alpha}$ is determined by the Verdet constant of the material and the direction of $\vec{\alpha}$ will be along the direction of laser propagation ($\hat{k}$). In ferromagnetic MO materials however, the magnitude of $\vec{\alpha}$ (or "effective Verdet constant") differs along different crystalline directions and the direction of $\vec{\alpha}$ is generally different from $\hat{k}$, unless the crystal is optically probed along a principal magnetization axis. In both cases (paramagnetic, ferromagnetic) the (effective) Verdet constant is dependent on intrinsic material properties, and varies with the wavelength $\lambda$ of the light beam.

Figure 2:
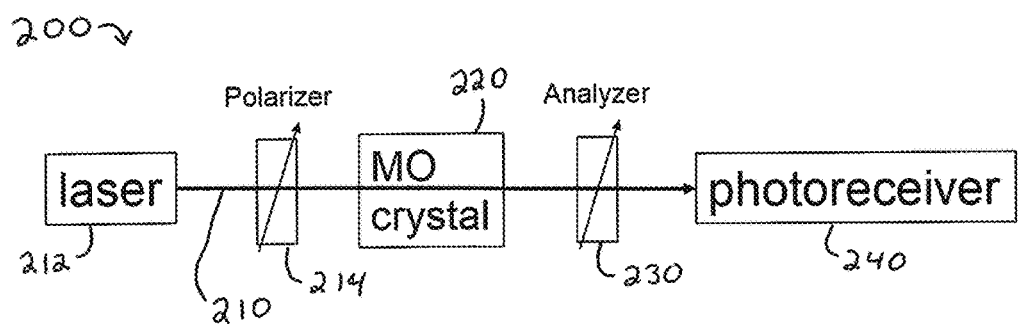
FIG. 2 shows components of an exemplary polarimetric MO sensor.

To utilize the Faraday Effect to detect and measure an external magnetic field, a polarimetric configuration is employed. The components of a generic polarimetric MO sensor 200 are illustrated in FIG. 2. A linearly polarized laser probe beam 210, produced by a laser 212 and a polarizer 214, is sent to an MO crystal 220. The transmitted beam is then passed through an analyzer (polarizer) 230 and finally collected by a photoreceiver 240. The photoreceiver 240 converts the optical power it receives to an electric signal (a current or voltage) which can be monitored by a readout instrument such as an oscilloscope or spectrum analyzer. Under zero applied field, the optical power P received by the photoreceiver will be a steady-state quantity which is given by Malus' Law:

$$P=P_0\cos^2\theta_p \quad (2)$$

where $P_0$ is the total optical power and $\theta_p$ is the angle between the transmission axes of the polarizer and analyzer. In the presence of optical activity or net Faraday rotations produced by internal magnet moments within the MO crystal, an offset term may be added to $\theta_p$. However for the MO crystals considered in the present description, such effects were either not observed or were negligible.

Under an applied magnetic field, the polarization vector of the laser ($E_{opt}$) will undergo a rotation $\theta_{FR}$ as illustrated in FIG. 1. Consequently, the optical power received by the photoreceiver will undergo a field-induced modulation $\Delta P$ given by:

$$\Delta P=P_0[\cos^2(\theta_p+\theta_{FR})-\cos^2\theta_p] \quad (3)$$

In high sensitivity applications, which typically involve magnetic fields much smaller than the saturation point of the MO crystal, the Faraday rotation will be very small and Equation (3) can be expressed in its differential form:

$$dP=-P_0\sin(2\theta_p)d\theta_{FR}. \quad (4)$$

In substituting Equation (1) into Equation (4), it can be seen that the power modulation dP is directly proportional to the external field strength. That is, the measured signal voltage from the photoreceiver can be converted to a magnetic field strength through a simple conversion factor that can be obtained through sensor calibration in a known external field. This proportional relationship is regarded as "linearity," and is an important property of MO sensors. In applications with sufficiently larger magnetic fields, the field strength must be derived through Equation (3). According to Equation (1), the output of a linear MO sensor would yield a vector component of $\vec{H}$ along the sensitivity axis ($\vec{\alpha}$). To resolve spatial vector components (x, y, z) of $\vec{H}$, a 3-axis MO sensor can be constructed with three MO sensors whose sensitivity axes are oriented in orthogonal directions.

Figure 3:
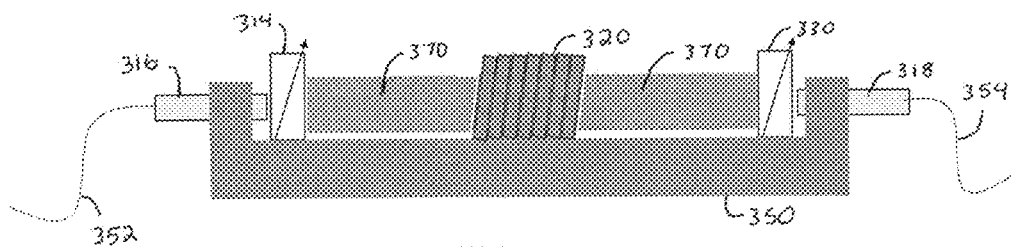
FIG. 3 shows components of an exemplary polarimetric MO sensor.

An illustration of an exemplary Ultra-sensitivity Optical Fiber Magneto-optic Field Sensor 300 is shown in FIG. 3. The various components form a polarimetric configuration, similar to FIG. 2. Some of the mechanical design parameters exhibit similarities to that described in Apparatus and System for a Quasi Longitudinal Mode Electro Optic Sensor for High Power Microwave Testing (US Patent Application Publication No. US/2010/0264904)—incorporated herein by reference in its entirety—used for the detection of electric fields. For brevity, greater detail will be placed on the descriptions of novel components and configurations herein. In this section these features will be described in detail, along with the underlying experimental data and theoretical modeling from which they were derived. To understand exemplary configurations and components in an organized and structural manner, a summarized list of these components and features is provided below.

The MO crystal element 320 and optical components are mounted in a rigid, nonmetallic housing 350 (preferably, e.g., a machinable ceramic such as Macor™). The nonmetallic composition of the housing 350 minimizes perturbation of electromagnetic fields, which can affect measurement accuracy. The rigidity of the housing 350 is important in order to maintain alignment between the input and output optical fibers 352, 354, and to minimize vibration-induced noise. The preferred sensor housing configuration will be cut from a single piece of machinable ceramic rather than a modular design with many pieces attached together. The geometry and configuration of the housing 350 has been optimized in earlier sensor prototypes utilized in railgun applications, which were subject to enormous mechanical strain.

Figure 4:
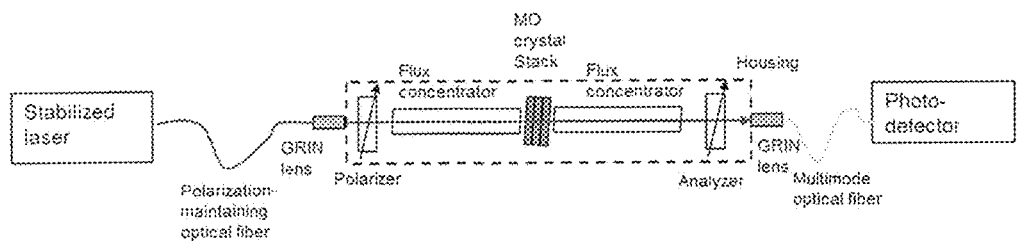
FIG. 4 shows an exemplary linear sensor.
Figure 5:
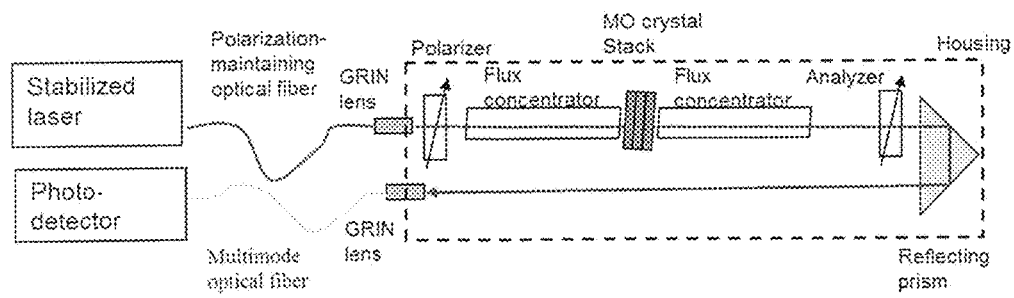
FIG. 5 shows an exemplary reflective sensor.
Figure 6:
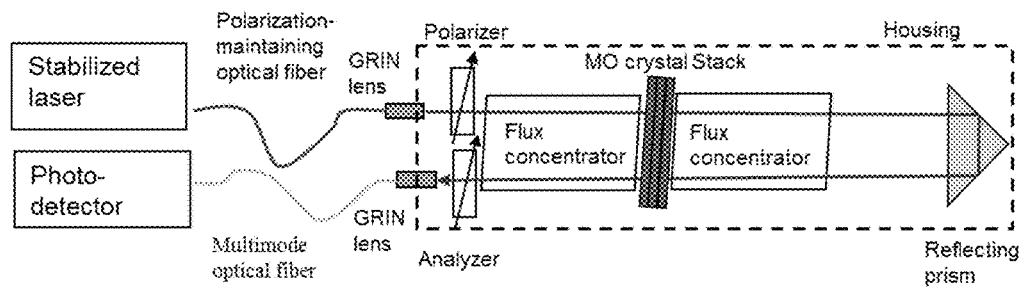
FIG. 6 shows an exemplary multipath sensor.

The preferred geometry of the sensor housing 350 is a linear design in which the laser beam travels along a straight path, and the input and output fibers 352, 354 reside on opposite ends of the sensor head, which is a single, continuous unit of material. An alternate reflective design, which is suitable for measurements in confined spaces, involves the usage of a reflection prism. In the reflection mode design, the input and output optical fibers reside on the same ends of the sensor, allowing the sensor to be placed inside a cavity without the need of bending a fiber. An illustration of the linear and reflection designs are shown in FIGS. 4 and 5, respectively. The principles and operation of the two sensors are identical. A third "multipath" sensor configuration is shown in FIG. 6. In the multipath design, the detailed physics is different from the design used in linear and reflection sensors, due to polarization changes introduced in the reflecting prism and compensator prior to reaching the analyzer.

A polarization maintaining (PM) fiber may be used for the input optical fiber 352. Polarization maintaining fiber is preferred in order to inhibit polarization drifts, which can cause fluctuations in the total optical power ($P_0$) when the laser passes through the polarizer.

The laser exits the PM fiber through a collimating lens 316. The collimating lens minimizes the amount of divergence in the laser beam after it exits the fiber. This allows the laser to be collected more efficiently by the receiving collimating lens 318 on the opposing end of the sensor, i.e., the collimation minimizes insertion losses.

The transmission axis of the input polarizer is aligned with the direction of laser polarization exiting the fiber. This alignment maximizes the total optical power ($P_0$) and improves efficiency. The input polarizer 314 also minimizes noise and stabilizes sensitivity, which will be explained in further detail below. Thin film polarizers with high extinction ratios, such as Corning Polarcor™ are preferred for both polarizer 314 and analyzer 330 for their small size, which helps to minimize sensor footprint.

The main purpose of the output optical fiber 354 is to collect the modulated optical signal and send it to the photoreceiver (not shown). Since the photoreceiver only measures optical power and is insensitive to polarization, polarization maintaining fiber is not necessary (but still may be used). Multimode fiber is a practical choice, based on its low cost and its large core diameter (which can improve coupling efficiency between input and output fibers). The direction of the transmission axis of the analyzer will be discussed in greater detail below.

Figure 7:
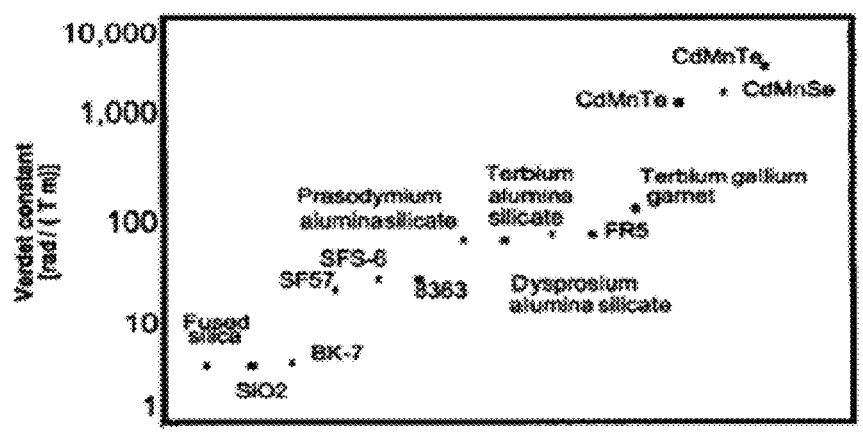
FIG. 7 shows Verdet constants for different materials between 633-670 nm.

According to Equation (1), intrinsic sensitivity of an MO sensor can be optimized by choosing a material with a very large Verdet constant. FIG. 7 shows the Verdet constants for several common MO materials. While CdMnTe shows the largest Verdet constant among these materials, it exhibit a parasitic electro-optic effect. That is, it responds to electric fields as well as to magnetic fields, making the material unsuitable for magnetic field sensing. Secondly, the spectral response of the Verdet constant of CdMnTe indicates that higher sensitivities would be obtained at optical wavelengths below 633 nm, where high quality lasers and fiber optic components are more costly and of limited availability, compared to those at higher wavelengths. Furthermore, photoreceivers designed for lower wavelengths usually have lower quantum efficiencies and lower responsivities, compared to those that operate at higher (near infrared) wavelengths.

Bismuth-doped iron garnet crystals were developed in 1969 and found to exhibit a very large Faraday response to external magnetic fields. Fabrication and engineering of the material has evolved substantially since then, and bismuth doped iron garnets have become widely used in a variety of optical modulation applications. The nominal compositions of the crystals used in exemplary embodiments is given by the formula $(BiGdLu)_3(FeGa)_5O_{12}$. These crystals, often denoted Bi:RIG (Bismuth doped rare earth iron garnet) exhibit an effective Verdet constant of $2 \times 10^4$ rad/Tm, about an order of magnitude larger than those of CdMnTe. Additionally, Bi:RIG does not exhibit a parasitic electro-optic effect, and is designed to be operated near telecommunication wavelengths (1310-1550 nm), where a large selection of high quality, low cost, lasers and photoreceivers are available. But despite these advantages, Bi:RIGs have had rather limited use in sensor applications. The main reason for this is that Bi:RIG crystals contain ferromagnetic domains, which introduce a variety of complicated and parasitic phenomena—most notably damping effects in the domain wall motion, magnetically induced optical incoherence, and a frequency-dependent sensitivity axis.

Bi:RIG crystals are mostly utilized as components in optical isolators and circulators. In these applications, the parasitic effects are avoided by operating the crystals in a magnetically saturated state (using a large static, external field). This eliminates the domain walls and allow the intrinsically large (effective) Verdet constant to be utilized. In sensing applications however, this is not a practical solution because the saturating field will reduce sensitivity to the external field (which will typically be smaller, time-varying, and in an arbitrary direction). It is likely that the aforementioned parasitic effects have been detriments to previous developments of MO sensors using Bi:RIG crystals, particularly because of the inherent difficulties they introduce in sensor calibration, i.e., the ability to accurately determine field strength or to resolve spatial vector components. In extensive experiments with Bi:RIG crystals, however, it was found that the inherent complications listed above can be overcome, and even exploited to enhance sensitivity through the unique configurational parameters of the crystals and optical biasing which will be described herein.

Bismuth-doped rare-earth iron garnet crystals are commercially available and grown as thick films through liquid phase epitaxy (LPE). The films are removed from their substrates, polished, and cut into rectangular die (typically 2 mm squares). The film thicknesses obtained through the LPE process are between 0.2 and 0.5 mm. As indicated in Equation (2), the sensitivity of an MO sensor generally depends on the length of the crystal. Therefore, in order to increase the effective length of the MO material, it is necessary to stack the individual Bi:RIG die in a linear array along the optical path, as illustrated in FIG. 3.

Figure 8:
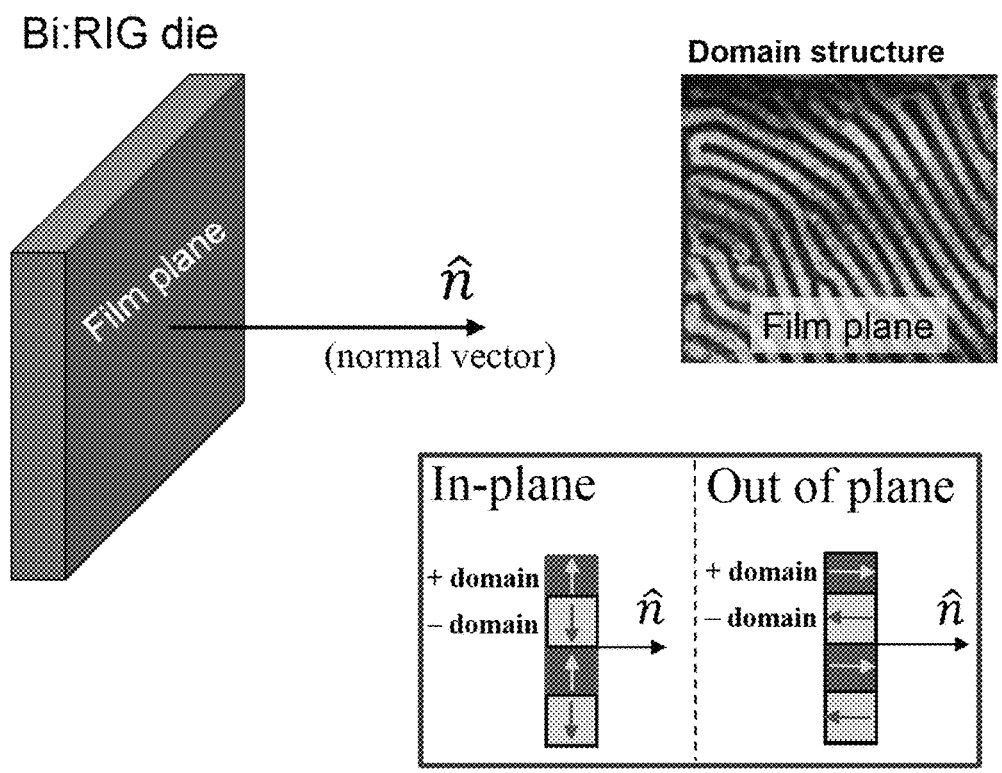
FIG. 8 shows the definition of normal vector n̂ and illustration of ferromagnetic domain geometry that may be exploited. The inset shows a side view of in-plane and out-of-plane films. In-plane films have the easy axis of magnetization (direction of internal magnetic moments [arrows]) along the plane of the film (perpendicular to n̂). Out-of-plane films have their easy axis perpendicular to the film plane (parallel to n̂)

Bi:RIGs naturally contain ferromagnetic domains, i.e., regions in which the material is magnetized to saturation. The direction of magnetization relative to the film plane is a critically important parameter in MO sensors based on stacked Bi:RIG films. A polarization microscopy photo of a typical domain structure in a Bi:RIG film is shown in FIG. 8. The light and dark serpentine-like patterns on the film plane define domains of opposing polarities (denoted as positive and negative domains). The direction of the magnetization or "easy axis" within these domains may be along the plane of the film (denoted as "in-plane" or "planar anisotropy"), perpendicular to the plane of the film (denoted as "out of plane" or "perpendicular anisotropy"), or a combination of the two (denoted as "canted"). In-plane (IP) and out-of-plane (OP) films are illustrated in the inset of FIG. 8. The anisotropy can be controlled by the crystal grower through the film composition, and through various film growth parameters during the fabrication process.

Figure 9:
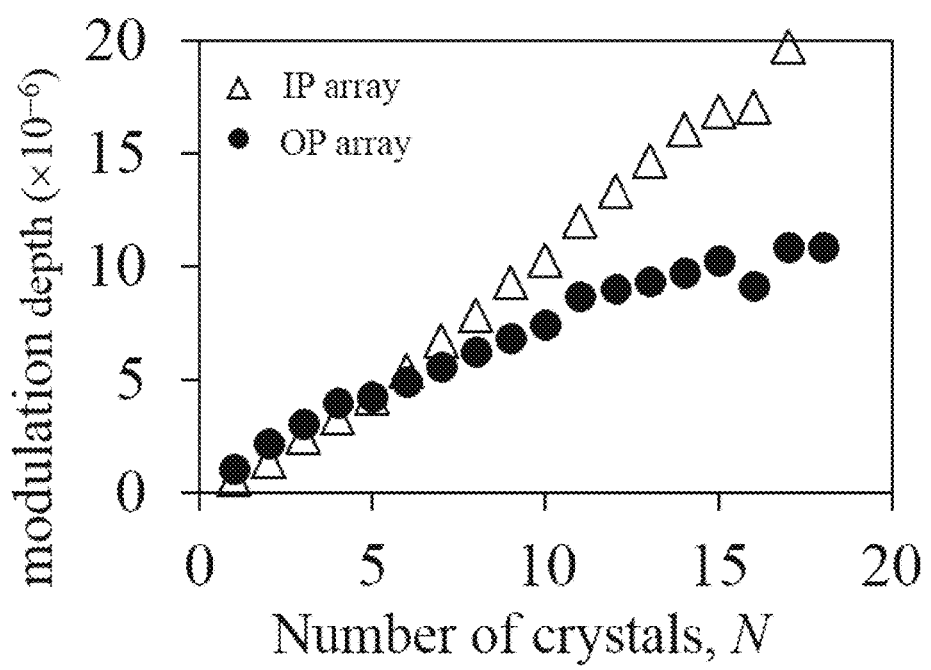
FIG. 9 shows a comparison of optical modulation depth in MO sensors constructed with arrays of IP and OP films.

Since the planar surface of the films are polished, sensors are conventionally configured with the propagation direction of the laser along the normal vector $\hat{n}$, as defined in FIG. 8. In this configuration, it was found that single OP films were generally about twice as sensitive as single IP films. However in stacked configurations, arrayed IP films exhibited higher sensitivities than arrayed OP films. This phenomenon is due to magnetically induced optical incoherence (MIOI) generated by the domains in in the OP films. MIOI depresses sensitivity progressively as the number of die in the stack (N) is increased. This results in severe sensitivity losses in arrayed OP sensors. An example of data demonstrating MIOI and the advantages of IP films in stacked arrays is shown in FIG. 9.

Figure 10:
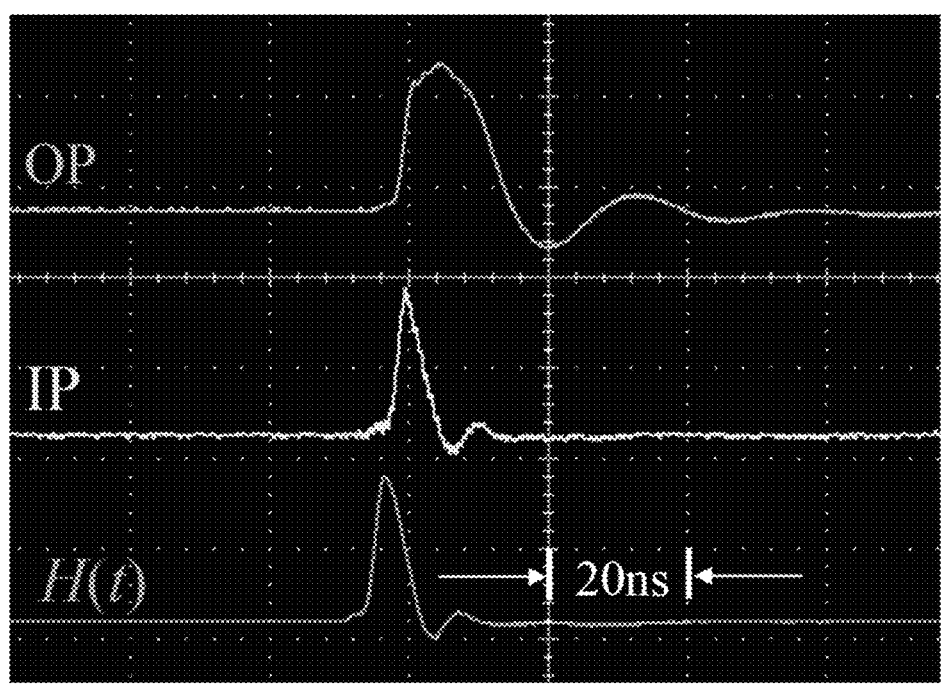
FIG. 10 shows oscilloscope data of the Faraday response of OP film (top trace) and IP film (middle trace) under a pulsed magnetic field (bottom trace).

In addition, IP films which are optically probed along $\hat{n}$ (the hard axis of magnetization) will have a stable sensitivity axis and will not exhibit damping effects that are known to affect sensor linearity and bandwidth. An example of damping in the MO signal is shown in FIG. 10. The waveform of an external magnetic field H(t) (bottom trace) was well-replicated by the modulation signal of the IP film. The OP film however, could not replicate this waveform due to damping effects in the domain wall motion. Therefore, planar anisotropy is required to avoid parasitic effects associated with MIOI, domain wall damping, and sensitivity axis variations, in stacked arrays of Bi:RIG films.

Figure 11:
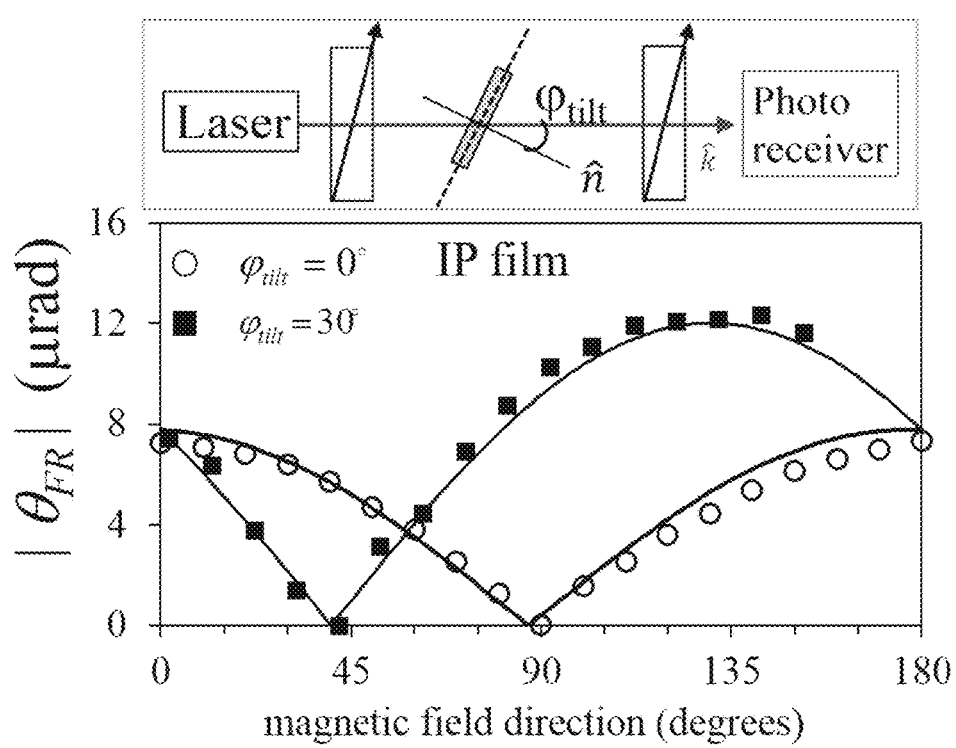
FIG. 11 shows Faraday rotation as a function of magnetic field angle (measured with respect to n). When the crystal was tilted by 30 degrees, the peak responsivity improved by 50%.

Another technique of exploiting the ferromagnetic domains to improve sensitivity is through the use of off-axis optical probing. In the Bi:RIG crystal stack shown in FIG. 3, it can be seen that the crystals are placed in a tilted position within the sensor. This tilted orientation is employed to improve sensitivity, and is motivated by various experimental data, such as those shown in FIG. 11. The data shows the Faraday rotation produced in an IP film as the angle of the magnetic field (measured with respect to the film normal $\hat{n}$) is varied by 180°. The data was collected with and without a tilt angle implemented to the crystal. The tilt angle, $\varphi_{tilt}$, is defined as the angle subtended between the normal vector $\hat{n}$ and the wave vector of the laser $\hat{k}$, as illustrated in the top of FIG. 11. In the graph of FIG. 11, it can be seen that the peak Faraday rotation obtained by the IP film in the tilted configuration was 50% larger than the peak value obtained when $\varphi_{tilt}=0°$. While this improvement was partially due to a 6% increase in the optical path length (L), most of the gain was due to the higher intrinsic responsivity in the tilted configuration. The reason for this higher responsivity is that a component of the laser is probing along the easy axis of the film, which naturally has a larger responsivity (in a similar manner as the higher responsivity of OP films).

The main drawback to utilizing a tilted configuration in arrayed structures is the effects of magnetically induced optical interference (MIOI), which can negate the sensitivity improvements and even cause sensitivity losses. To mitigate this, tilt angles much smaller than 30° (which was used in FIG. 11) should be implemented in an array. The optimal tilt angle depends on the number of films in the array; as the number of crystals N increases, the value of $\varphi_{tilt}$ must decrease. Typical values of $\varphi_{tilt}$ in exemplary arrayed MO sensors are between 1-5 degrees and typical sensitivity improvement over non-tilted configurations is 5-10%. This sensitivity gain is modest, compared to those obtained by other techniques which will be discussed further below.

Figure 12:
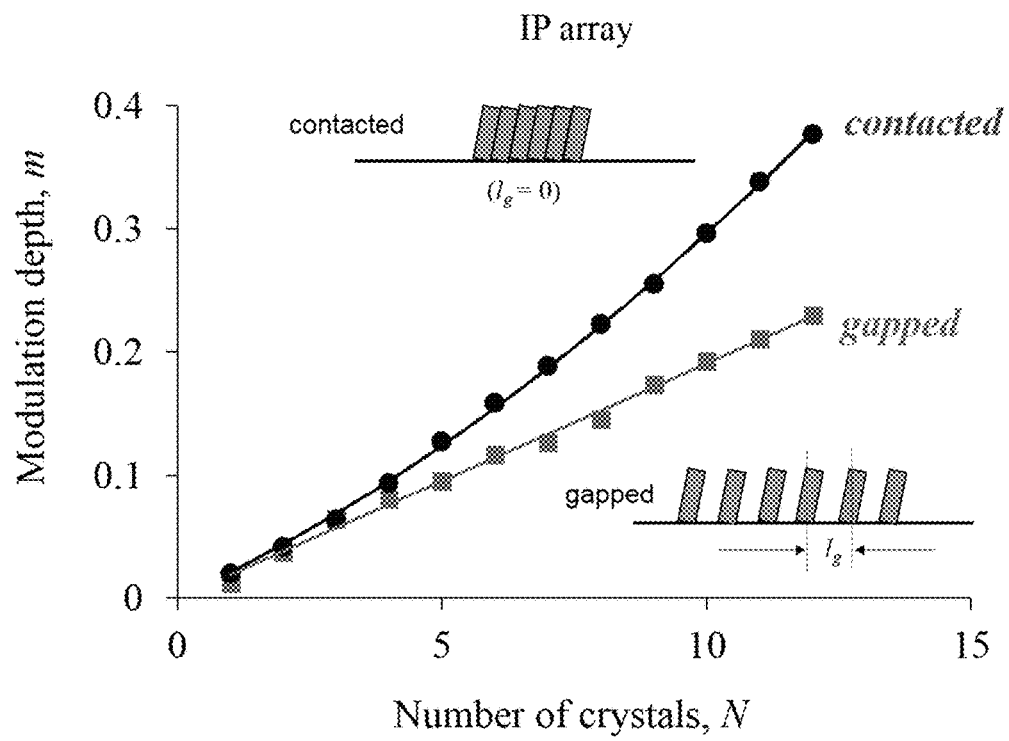
FIG. 12 shows experimental measurement of modulation depth as a function of stacking number N. Enhancement when crystals are placed in contact is due to demagnetization effects.

Another important design parameter in assembling the Bi:RIG crystal stack in FIG. 3 involves the spacing between the individual IP crystals. It was found through our experiments that stacked arrangements in which the films are placed in physical contact exhibit higher responsivities than those in which air gaps are present between the films. A comparison of these two cases is shown in the data of FIG. 12. In the gapped arrangement, the modulation depth m from the MO sensor, defined as $\Delta P/P$, exhibited a proportional increase with N. This behavior is theoretically predicted based on the linear increase in total crystal length L. When the spacing between crystals $I_g$ (see FIG. 12) was reduced to zero, the behavior of the modulation depth changed from linear to quadratic.

Implementing the quadratic effect shown in FIG. 12 is an important technique of sensitivity optimization. The sensitivity improvement when the crystals are placed in physical contact is due to an increase in the internal magnetic field. Generally, when an MO crystal is placed in an external magnetic field, the magnetic field within the magnetic body will be inversely proportional to the relative permeability $\mu'$, given by:

$$\mu'=1+\eta\chi, \quad (5)$$

where $\chi$ is the magnetic susceptibility (an intrinsic material property), and $\eta$ is the demagnetization factor. The demagnetization factor is dimensionless with a value between 0 and 1, which is determined by the geometry of the magnetic body. A small value of $\eta$ is generally desired in an MO sensor because the internal field within the crystal will be maximized, along with the Faraday rotation and overall sensitivity.

Figure 13:
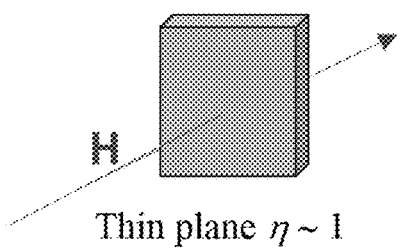
FIG. 13 shows the thin plane limiting geometrical case producing a demagnetization factor of 1.
Figure 14:
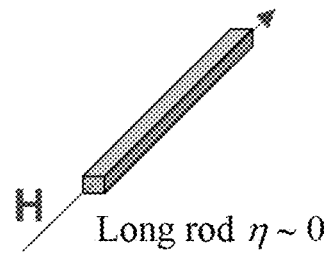
FIG. 14 shows the long thin rod limiting geometrical case producing a demagnetization factor of 0.

FIGS. 13 and 14 illustrate two important limit cases. Crystals resembling a thin plane, as shown in FIG. 13, present the least desirable geometry, since $\eta\sim1$. Crystals resembling a long, thin rod, as illustrated in FIG. 14, are preferred, since $\eta\sim0$, and the internal field will be maximized. The Bi:RIG die, whose planar dimensions are 2 mm squares, and whose thicknesses are ≤0.5 mm, unfortunately resemble the thin plane geometry shown in FIG. 13. Therefore they do not represent the optimal geometry for high sensitivity. However, when the Bi:RIG films are stacked in a linear array and placed in physical contact, the domain magnetizations of the individual crystals may become coupled, allowing the stack to resemble a solid magnetic body. As the number of crystals is increased, the geometry of the stack approaches that of the long rod of FIG. 14, the demagnetization factor reduces, and sensitivity improves. Conversely, if a substantial air gap is present between the films, the domains are decoupled and the demagnetization factor is equivalent to that of a single die. For this reason, the modulation depth of the gapped assembly in FIG. 12 increased proportionally with N, while the contacted assembly increased at a faster rate.

Figure 15:
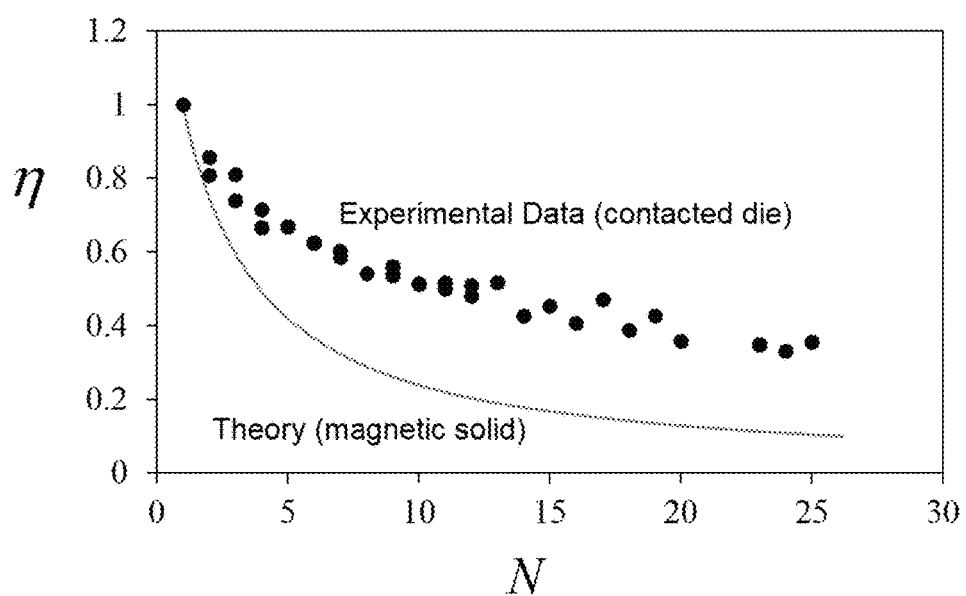
FIG. 15 shows experimental data for $\eta$ for Bi:RIG stack compared to theoretical values for continuous magnetic body of equivalent dimensions.

The ratio of the two data sets in FIG. 12 provide an experimental measurement of η for a stacked array of Bi:RIG in physical contact. This ratio is plotted in FIG. 15. The reduction in η with increasing N demonstrates the important role of array geometry. The sensitivity gained by placing the films in contact is simply 1/η. For example, at N=20 the sensitivity gain is 1/0.4=2.5. Also plotted in FIG. 15 is the theoretical demagnetization factor for a uniform magnetic body with equivalent dimension of the Bi:RIG stack with N crystals. The larger values of η for the experimental data indicates smaller internal fields (and lower sensitivity) in the stacked structure, compared to a continuous magnetic body. This discrepancy is important and is due to imperfect domain coupling, resulting in boundary demagnetization effects between the crystal die within the stack. The theoretical plot in FIG. 15 indicates that if these boundary effects can be suppressed or eliminated in the stacked Bi:RIG array, an additional sensitivity improvement of a factor 3-4 can be achieved.

Figure 16:
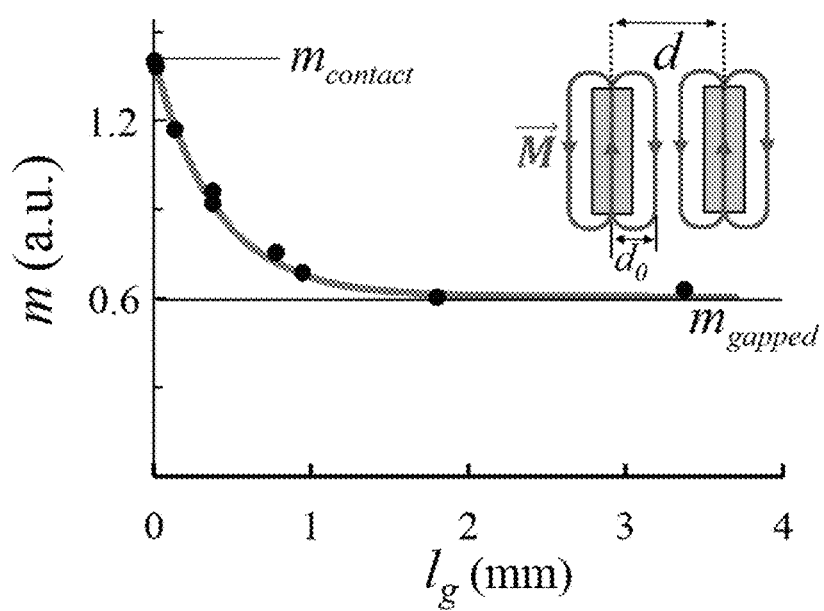
FIG. 16 shows evidence of coupling between the domains of adjacent films.
Figure 17:
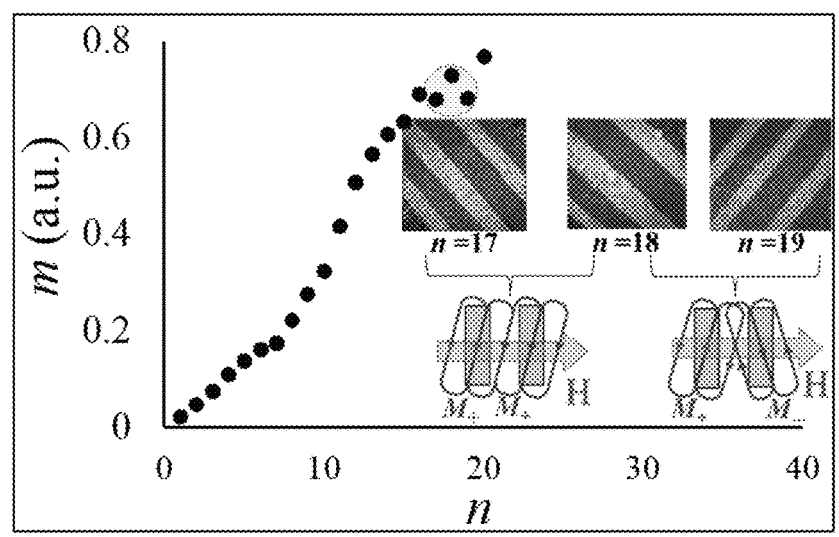
FIG. 17 shows three polarized light micrographs illustrating the positive and negative domains within three adjacent films whose m data exhibit an erratic fluctuation.

Evidence of coupling between the domains of adjacent films is shown in the data of FIG. 16 where the modulation depth m for a fixed number of films (N=14) was measured as a function of spacing $I_g$. The continuous transition from $m_{gap}$ to $m_{cont}$ indicates that coupling between gapped films occurs through the spatial extent (and overlap) of the domain field lines $\vec{M}$, as illustrated in the inset of FIG. 16. A method used to optimize domain coupling between films in the exemplary embodiment is to match domain patterns between adjacent films within the stack. For example, the three polarized light micrographs in FIG. 17 show the positive and negative domains (light and dark regions) within three adjacent films (Films 17, 18, 19) whose m data (encircled in the graph) exhibit an erratic fluctuation. Specifically, an improvement in m was obtained when Film 18 was added to the array, while a reduction in m was obtained when Film 19 was added. In comparing this behavior to the polarization micrographs, it is seen that the increase and decrease in m correlate with the matching and mismatching of domain patterns respectively. A proposed mechanism by which domain matching affects responsivity is illustrated in the inset of the graph. When similar domains ($M_+$, $M_+$) are exposed to a perpendicular field, the rotation of each domain is enhanced by the (in-phase) motion of the neighboring domain. In the case of opposing domains ($M_+$, $M_-$), the rotational motion of one domain is repelled by the opposing rotation of the other. In contacted arrays consisting of poorly (or randomly) matched domains, no quadratic effect is observed, and responsivities are similar to those of gapped arrays. Therefore, domain matching is an important technique in the exemplary embodiment.

Figure 18:
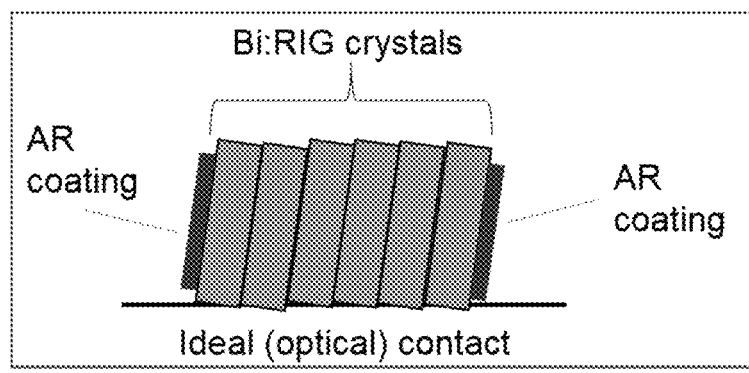
FIG. 18 shows an ideal crystal stack without AR coating between each layer.
Figure 19:
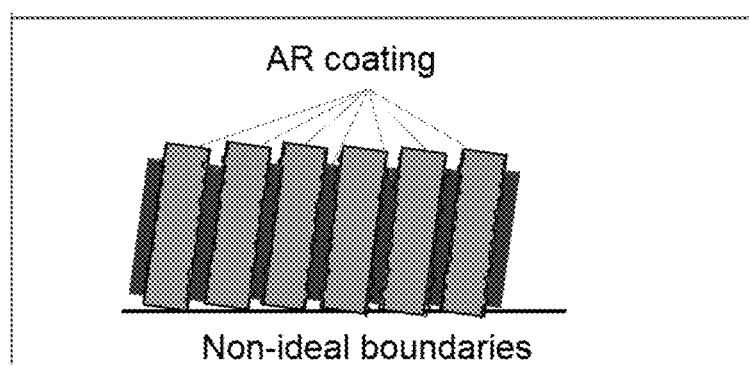
FIG. 19 shows an exemplary crystal stack with AR coating between each layer.

Besides boundary demagnetization effects that reduce internal fields, imperfect physical contact between the Bi:RIG die can also reduce sensitivity through reflections of the laser probe beam at the boundaries between the crystals, which can cause transmission losses and interference effects. In the ideal case of perfect optical contact between the crystals, these effects will be absent, except at the first and last crystals of the stack (where air/crystal interfaces are present). In this idealized case, antireflective (AR) coating on the end crystals can be used to mitigate these losses, as illustrated in FIG. 18. However, perfect optical contact between Bi:RIG crystals is difficult or impossible to achieve. Therefore, to minimize insertion losses, AR coating must be deposited on each crystal within the stack, as illustrated in FIG. 19. The dramatic effect of AR coating on the stacked crystals is demonstrated in the data of FIG. 20. Two arrays of planar Bi:RIG films were assembled and the transmitted laser power was measured as a function of the number of films in the stack (N). The crystals in one array were AR coated, while the crystals in the other array contained no AR coating. Both arrays were assembled with the crystals in physical contact and probed with an 18 mW laser. It can be seen that the transmitted power falls off faster in the uncoated crystals than in the AR coated crystals. The transmissivity (T) of each uncoated crystal is about 0.80, while in each AR coated crystal, T=0.93. The lower transmissivity in the uncoated crystals has a negative impact on sensitivity, especially when the crystals are stacked. This can be seen from the expression for the MO modulation: ΔP=Pm. Since P is proportional to $T^N$, and m increases quadratically with N, ΔP will be proportional to a stacking gain factor, given by:

$$g_s(N) = T^N(aN + bN^2), \qquad (6)$$

where a and b are constants. Computed values of $g_s(N)$ based on experimental data are plotted in FIG. 21 for AR coated and uncoated crystals. The peak value of $g_s(N)$, denoted $g_s(N^*)$ is of particular importance as it determines the optimum number of crystals to be used within the stack, and the optimum sensitivity that will be achieved. For the AR coated stack, this peak is reached at N*=21, with a gain factor of 9.4. For the uncoated stack (T=0.8), the negative impact of a lower transmissivity is obvious, as the value of $g_s(N^*)$ is only 2.0, occurring at N*=5. FIG. 22 shows computations of $g_s(N^*)$ as a function of T. The strong sensitivity near T=1 demonstrates the critical role of T in the MO sensor and the underlying motivation of the AR coating component. For example, if transmissivity can be modestly improved from T=0.93 to T=0.95, MO sensitivity will nearly double. If T can be further improved to 0.99, sensitivity will be increased 30-fold.

Figure 23:
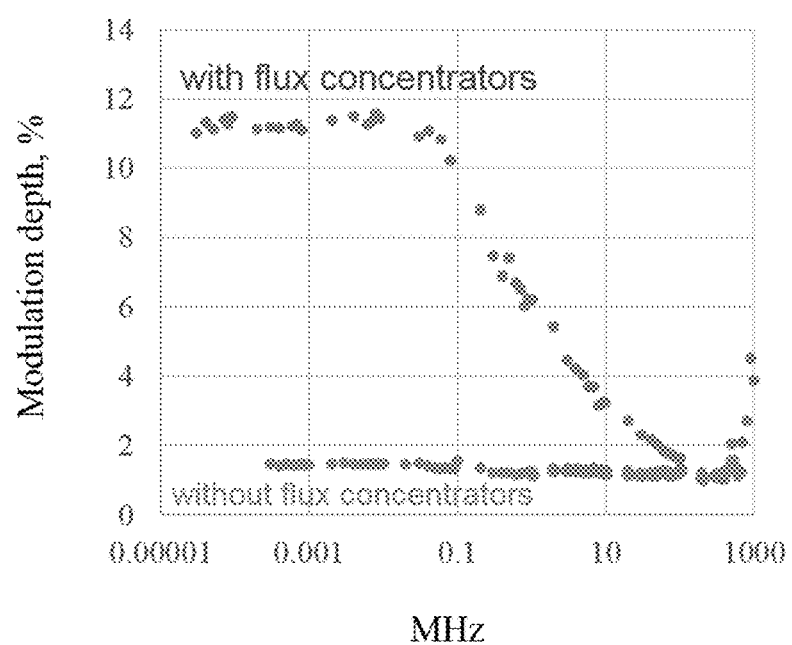
FIG. 23 shows frequency response data for Bi:RIG sensor with N=8 with versus without flux concentrators.
Figure 24:
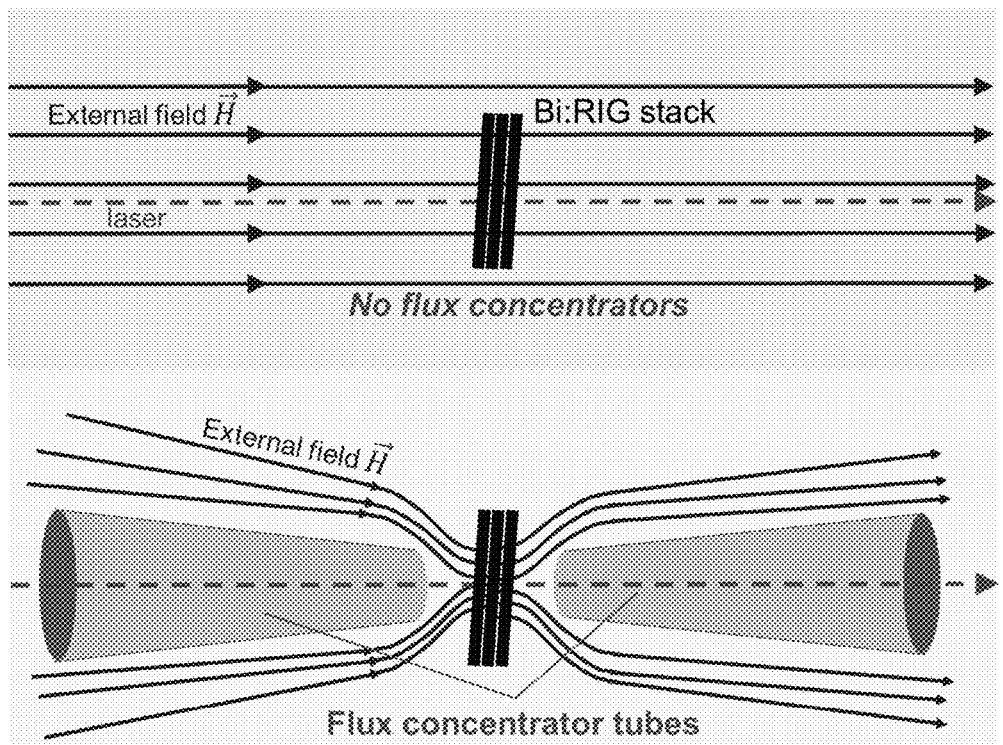
FIG. 24 shows an illustration of flux magnification mechanism responsible for MO sensitivity improvement.

The flux concentrators (FC's) 370, shown in FIG. 3, are optional components of exemplary MO sensors which increase sensitivity at lower frequencies. A comparison of the frequency response of a stacked MO sensor (N=8) with and without FC's is shown in FIG. 23. Below frequencies of 100 kHz, an eight-fold increase in sensitivity was obtained from the FC's. This FC gain factor, denoted $g_{FC}$, depends strongly on the number of crystals in the stack (N). Therefore, the optimal stacking number (N*) discussed above will be changed if flux concentrators are present. The mechanism by which sensitivity is enhanced by the flux concentrators is illustrated in FIG. 24. The magnetic field lines in the vicinity of the crystal, shown in portion (a) of FIG. 24, are displaced when the FC's are added, as shown in portion (b) of FIG. 24, in such a way that the magnetic field is magnified within the region of the crystal probed by the laser. The larger internal field increases Faraday rotation, resulting in larger modulation signals and higher sensitivity. Flux concentrators may be made from high permeability alloys (such as Metglas™ or Vitrovac™), and have been used in welding and other applications. For exemplary MO sensors, the configuration and shape of the FC's must be customized and adapted to the sensor geometry. In exemplary embodiments, the FC's may be constructed from foils of Vitrovac™. It was found that the optimal geometry and orientation of the FC's consist of two hollow cylindrical or conical tubes placed on each side of the crystal stack. The axis of the tubes are parallel to the optical path/axis, as shown in FIG. 24, and the end of the tubes should be placed in physical contact with the end crystals of the stack (the gap between stacked crystals and FC's shown in FIG. 24 is for illustrative purposes only). Since the crystals may be oriented with a tilt angle ($\varphi_{tilt}$), the edges of the FC tubes may be cut at a similar angle as $\varphi_{tilt}$, as illustrated in FIG. 25, so that uniform contact can be made with the crystals.

Figure 25:
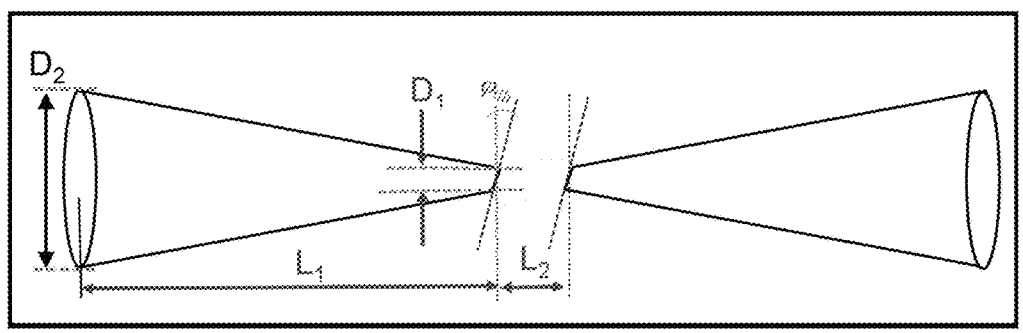
FIG. 25 shows an exemplary geometry of a flux concentrator tube.
Figure 26:
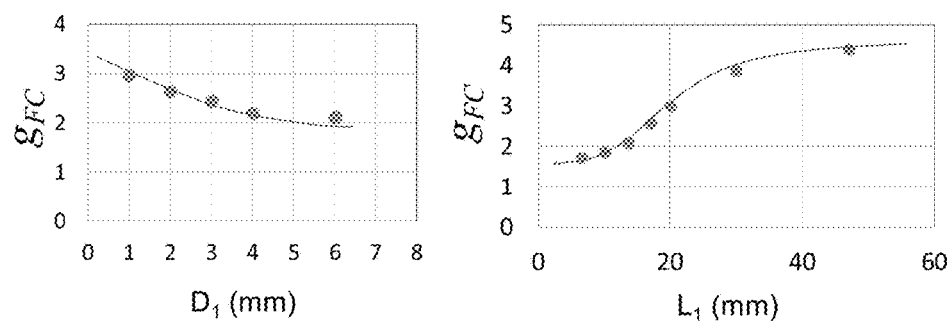
FIG. 26 shows data indicating that large values of $L_1$ and small values of $D_1$ are necessary for optimal sensitivity improvements.

Important parameters of the FC geometry are the tube diameter, $D_1$, the tube length, $L_1$, and the distance between the tubes, $L_2$, as defined in FIG. 25. Experimental measurements of the FC gain factor as a function of FC geometry indicate that the largest gains are achieved by long, thin tubes. Some of this data is shown in FIG. 26. As a result of this study, the FC's of exemplary MO sensors may be constructed with diameters ($D_1$) of about 1 mm, and tube lengths ($L_1$) of about 40 mm. The diameter $D_2$ on the opposing end of the FC tube is not a critical parameter. For example, a cylindrical tube of diameter $D_1$ will yield a similar FC gain as a conical tube of the same length in which $D_2 > D_1$. However, larger values of $D_2$ are commonly used because they simplify construction and alignment of the FC.

Figure 27:
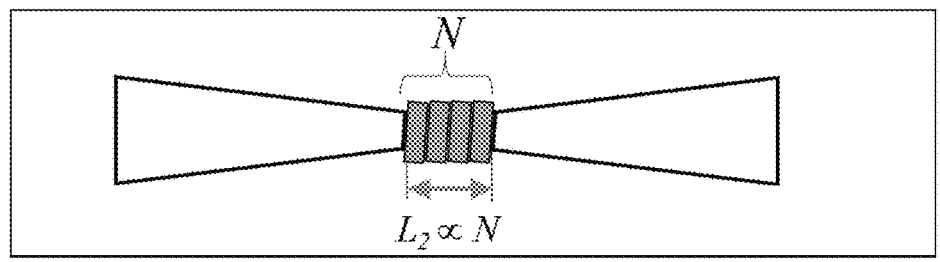
FIG. 27 shows that the spacing $L_2$ between FC tubes is limited by the stacking number N.

It has been found that an important parameter (indeed, the most important factor studied to date) in the design of the MO sensor with flux concentrators is the distance between the FC tubes ($L_2$). Since the FC tubes must be placed in physical contact with the end crystals of the stack, $L_2$ will be proportional to N, as shown in FIG. 27. It was found experimentally that the FC gain factor falls off quickly with increasing N, implying an inverse dependence on $L_2$. This inverse dependence can be seen in FIG. 28. At N=1, where the FC tubes are separated by the thickness of a single Bi:RIG film, the gain factor reaches its largest value of over 50. At N=10 ($L_2$=5 mm), the gain is reduced to 10, and at N=20 ($L_2$=10 mm), it becomes 5, an order of magnitude smaller than the N=1 value.

In the absence of flux concentrators, the optimal stacking number (N*) is determined from the peak value of the stacking gain $g_s(N)$, as discussed above. In the presence of flux concentrators, the corresponding quantity will be the product of the stacking gain and the FC gain, i.e.:

$$g_{tot} = g_s(N) g_{FC}(N). \qquad (7)$$

Figure 28:
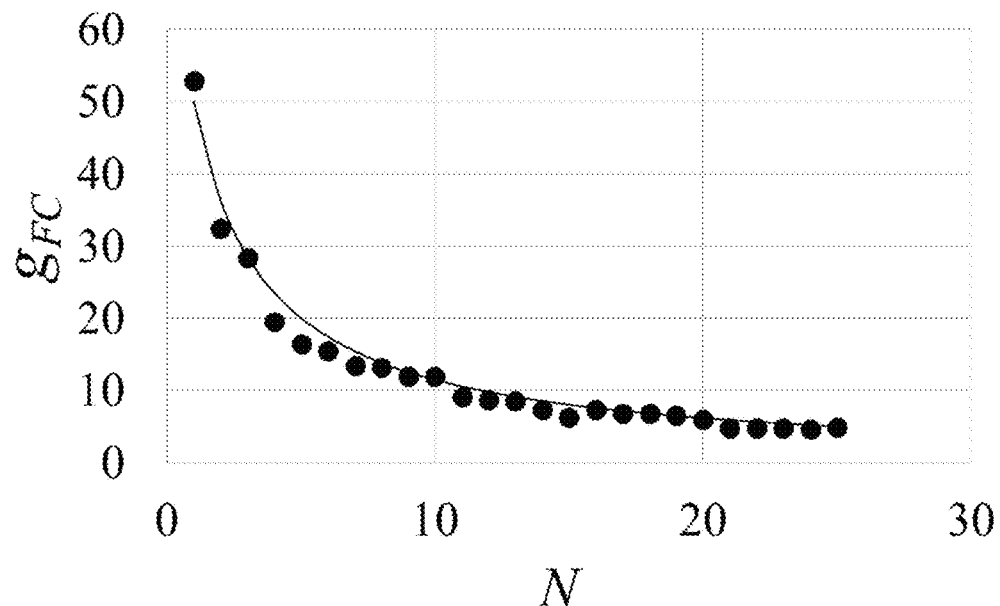
FIG. 28 shows data for the FC gain as a function of N. The strong sensitivity to N is due to the strong sensitivity to $L_2$.
Figure 29:
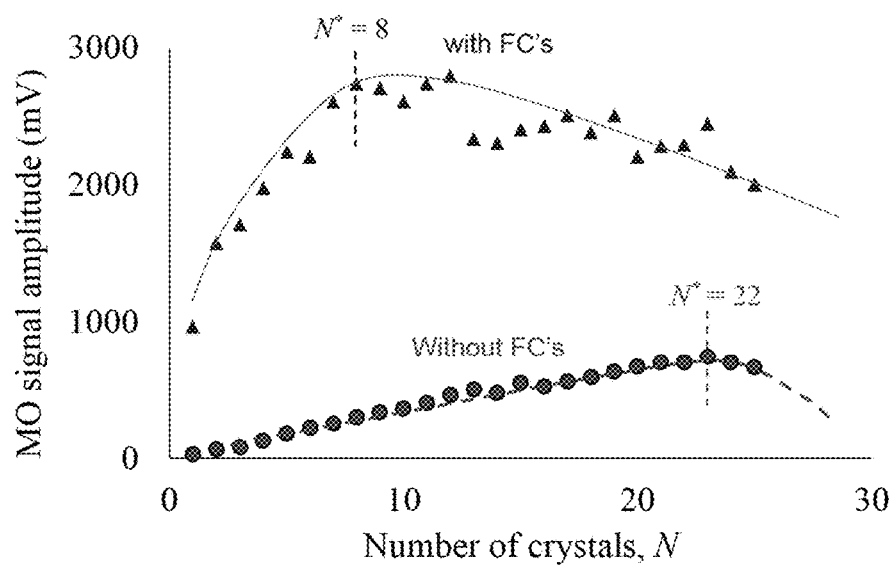
FIG. 29 shows experimental data taken at 50 kHz, demonstrating the sensitivity improvement obtained with flux concentrators in the MO sensor. The peak responsivity with FC's was 3.6 times larger, and was obtained with fewer crystals.
Figure 30:
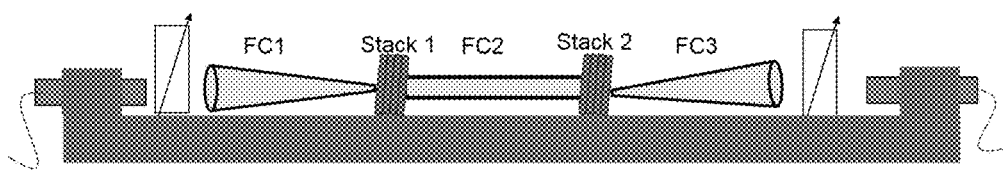
FIG. 30 shows an alternate configuration for an MO sensor with flux concentrators. The shorter stack of crystals reduce the value of $L_2$, allowing for a greater FC gain.

Because of the functional behavior of $g_{FC}(N)$ shown in FIG. 28, N* will be reduced substantially when flux concentrators are added to the MO sensor. FIG. 29 shows the amplitude of a low frequency (1 kHz) MO signal voltage as a function of N for a stack of Bi:RIG crystals. Without the flux concentrators, a peak signal amplitude of 750 mV is reached at 22 crystals. It should be noted that the value N*=22 is consistent with the predictions shown in FIG. 21. With flux concentrators present, a peak signal amplitude of 2700 mV was attained with only 8 crystals. Therefore when the flux concentrators were added, not only was sensitivity increased by a factor 3.6, but the number of crystals needed to achieve this higher sensitivity was decreased. While a factor 3.6 increase in sensitivity is substantial, it is modest in comparison to the fifty-fold increase observed obtained at N=1. An alternate method to potentially mitigate the lower value of $g_{FC}$ at larger values of N shown in the data of FIG. 28 is the use of multiple shorter stacks with multiple FC's, as shown in FIG. 30.

It is worthwhile to note that the MO signal amplitude in FIG. 29, without FC's and without stacking (i.e., N=1), was 25 mV. Therefore the maximum accumulated gain $g_{tot}$ in FIG. 29 is in excess of 100.

According to the frequency response data shown in FIG. 23, flux concentrators generally benefit MO sensors in continuous wave (CW) or fixed frequency applications below 100 MHz (convergence point of two data). Since the frequency response isn't flat between 100 kHz and 100 MHz, the response curve must be taken into account when converting signal voltages to field strengths. For pulsed applications, a flat response is generally necessary in order for the signal output from the MO sensor to accurately reproduce the original waveform of the external field. This implies that magnetic field pulses with rise times of ~10 μs (1/100 kHz) or greater and magnetic field pulses will yield good signal reproduction from the MO sensor. For pulses with shorter rise times, there will be some degree of waveform distortion, due to the roll off in $g_{FC}$ above 100 kHz.

The angle between the transmission axes of the polarizer and analyzer, $\theta_p$, as defined in Equation (2), is an important parameter in the MO sensor. A common misconception in MO sensors is that the value of $\theta_p$ that maximizes sensitivity corresponds to the value of $\theta_p$ which maximizes the MO modulation amplitude $dP_{MO}$. The value of $\theta_p$ that maximizes $dP_{MO}$ generally corresponds to the quadrature point, $\theta_p = 45°$, based on Equation (4). This can also be seen graphically from FIG. 31, which shows a theoretical plot of the optical power received by the photoreceiver P as a function of $\theta_p$. The highest responsivity to Faraday rotations will naturally occur where the slope $dP/d\theta_p$ is largest, i.e., at $\theta_p = 45°$.

In practice however, sensitivity and minimum detectable field are not determined by the peak responsivity, but rather by the peak signal to noise ratio (SNR). While peak responsivity is reached at an angular bias $\theta_p = 45°$, substantial noise will still be present in the system due to the large optical power level reaching the photodetector (P=0.5$P_0$), resulting in a mediocre SNR and an MO sensor which is not operating at its maximum sensitivity.

Figure 32:
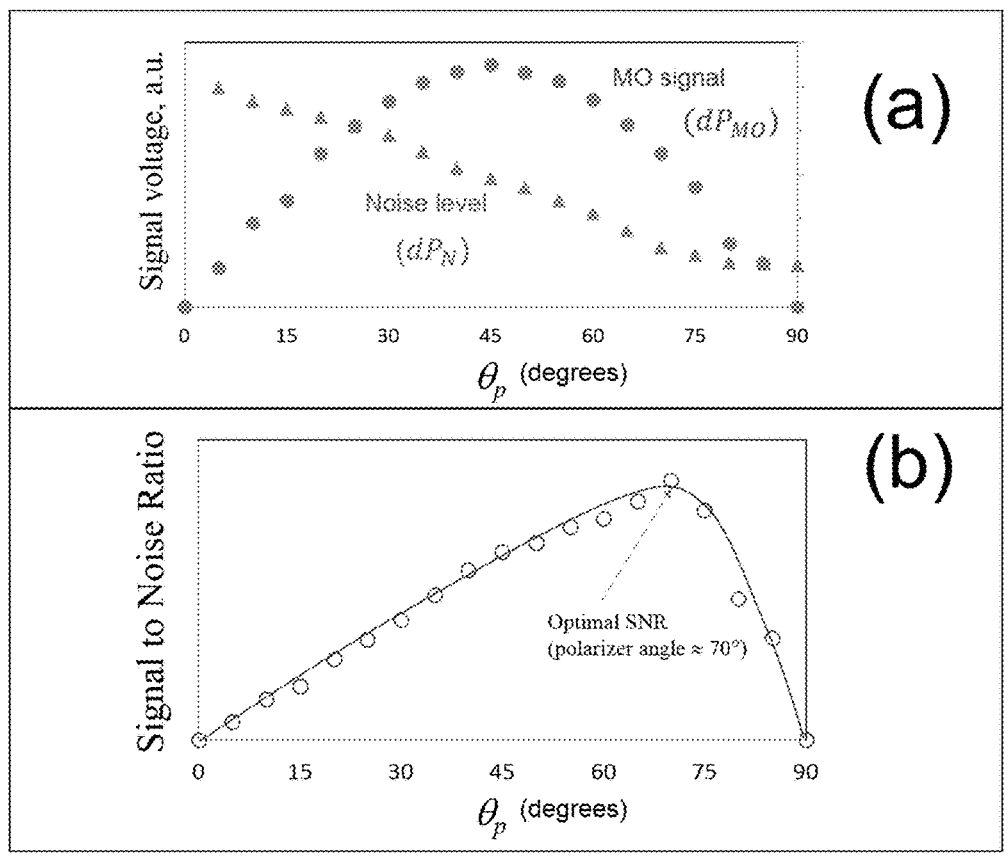
FIG. 32 shows amplitude of MO modulation signal and noise level in an MO sensor as the analyzer angle $\theta_p$ is varied. The ratio shows that the optimal SNR occurs at an analyzer angle which is offset from the quadrature point at 45°.

A procedure of experimentally determining the analyzer angle which maximizes SNR is shown in the data of FIG. 32. FIG. 32 shows simultaneous measurements of the MO modulation signal $dP_{MO}$ and the noise level $dP_N$ as the analyzer angle $\theta_p$ is rotated. The data for $dP_{MO}$ follows a sin $2\theta_p$ dependence with a peak value at $\theta_p = 45°$, as derived from Equation 4. The noise level $dP_N$, however, exhibits a different functional dependence. The maximum of $dP_N$ occurs at $\theta_p = 0°$ and the minimum occurs at the extinction point, $\theta_p = 90°$. This behavior is due to a linear relationship between $dP_N$ and P that will be discussed below. The ratio of the two data of graph (a) of FIG. 32 yields the SNR shown in graph (b) of FIG. 32. It can be seen that the peak of the SNR does not occur at the point of maximum responsivity ($\theta_p = 45°$) or the point of minimum noise ($\theta_p = 90°$), but rather at a point in between, ($\theta_p \approx 70°$). An important aspect of this result is that although the numerical value of the SNR generally depends on the external field strength, its functional dependence on $\theta_p$ has general features that show little or no variation with the external field strength—most notably a peak value at $\theta_p \approx 70°$, as in the data of FIG. 32. This generality will be demonstrated more rigorously below, since it is useful that $\theta_p$ be a fixed quantity rather something that is adjusted during each measurement.

The noise level in the measurement system ($dP_N$) depends linearly on the optical power transmitted through the analyzer (P). This relationship can generally be expressed:

$$dP_N = c_0 + c_1 P, \qquad (8)$$

where $c_0$ and $c_1$ are constants that depend on the noise characteristics of the photoreceiver and laser. If a high quality, stabilized laser is used, then most of the noise is usually associated with photocurrent shot noise and amplifier (Johnson) noise. The linearity expressed by Equation 8 can be seen in the experimental data shown in FIG. 33. From Equation (4), the magnitude of the MO modulation signal, $dP_{MO}$, is given by:

$$dP_{MO} = P_0 \sin(2\theta_p) d\theta_{FR}, \quad (9)$$

which can be rewritten:

$$dP_{MO} = 2(P_0 P - P^2)^{1/2} d\theta_{FR}. \quad (10)$$

Dividing Equation (9) by Equation (8), we obtain:

$$SNR = \frac{2(P_0 P - P^2)^{\frac{1}{2}} d\theta_{FR}}{c_0 + c_1 P}, \quad (11)$$

which has a maximum value at $P=P^*$, where:

$$P^* = \frac{P_0}{2 + P_0 c_1/c_0}, \quad (12)$$

Using Malus' law, the condition $P=P^*$ is attained at an analyzer angle $\theta_p^*$, which is given by:

$$\theta_p^* = \cos^{-1}\sqrt{1/(2+P_0 c_0/c_0)}. \quad (13)$$

It can be seen in Equation (13) that $\theta_p^*$ is independent of $d\theta_{FR}$, i.e., independent of the applied magnetic field. This is an important property of the MO sensor, which allows the analyzer setting to be fixed, yet always yield the optimal SNR. Additionally, computations of Eq. 13 typically yield values of $\theta_p^*$ between 70° and 80° when the constants $c_0$ and $c_1$ for various lasers and photoreceivers are used. This means that the analyzer bias angle $\theta_p^*$ will be more or less the same for all exemplary MO sensors.

Figure 31:
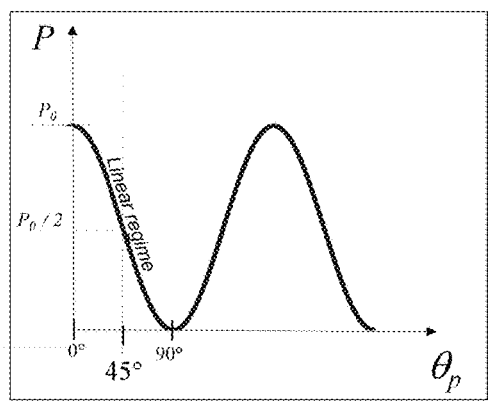
FIG. 31 shows a theoretical plot of the optical power received by the photoreceiver P as a function of $\theta_p$.
Figure 34:
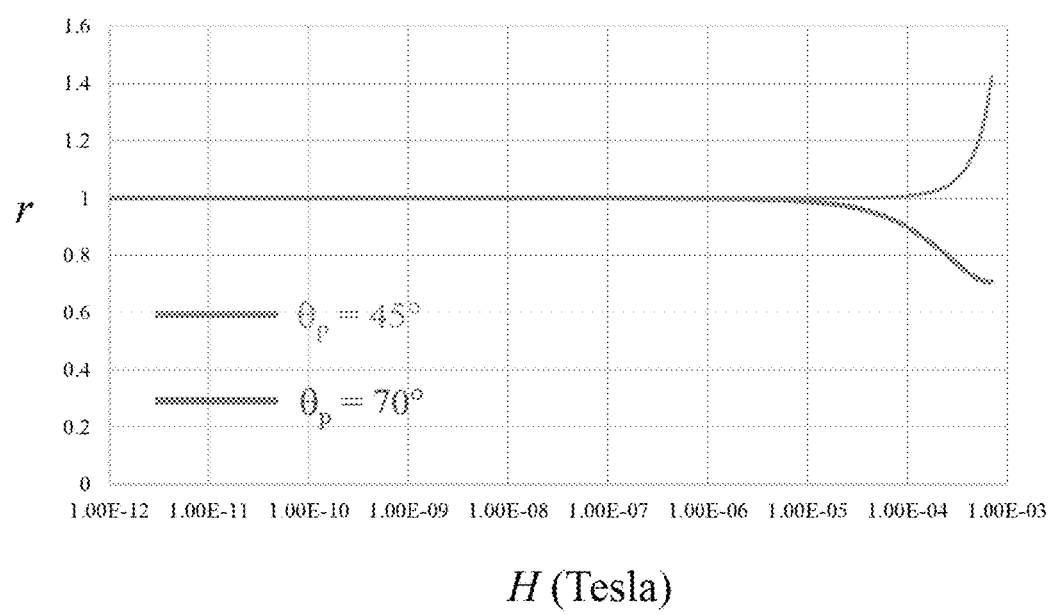
FIG. 34 shows the slight reduction in the linear range of the sensor using off-quadrature analyzer biasing.

The linear regime indicated in FIG. 31 refers to a range of Faraday rotation angles in which P can be well approximated by a straight line. In terms of sensor calibration and operation, the linear regime corresponds to the range of magnetic fields in which the optical modulation signal can be taken to be proportional to the applied field strength. This problem is mathematically equivalent to approximating the precise form for the MO modulation (Equation (3)):

$$\Delta P = P_0[\cos^2(\theta_p + \theta_{FR}) - \cos^2 \theta_p],$$

with the differential form $P_0 \sin(2\theta_p)\theta_{FR}$. In this regard, it is convenient to define the ratio:

$$r = \frac{\sin(2\theta_p)\theta_{FR}}{\cos^2(\theta_p + \theta_{FR}) - \cos^2 \theta_p} \quad (14)$$

and plot it as a function of H (magnetic field strength), to observe when it deviates substantially from r=1. Such a plot is shown in FIG. 34, using the optimized sensor configuration with a gain factor $g_{tot}=100$. A 10% deviation from r=1 occurs at H=1 G ($10^{-4}$ T) when $\theta_p=70°$, and H=4G ($4\times10^{-4}$ T) when $\theta_p=45°$. This simply means that above these fields, accurate computations of H would involve using Equation (3), rather than the linearized approximation. In most RF detection applications however, the magnetic field strengths are well below 1 G and the MO sensor will be well within in its linear regime. For example, currently, the minimum detectable field in exemplary stacked Bi:RIG MO sensors is about $10^{-8}$G ($10^{-12}$ T). To extend the linear regime to higher field strengths, MO sensors can be constructed with lower gain factors. An MO sensor constructed with $g_{tot}=1$ (for example) will have 100 times less sensitivity, but the linear range will be increased by a factor 100. Similarly, a larger linear regime can be obtained by replacing the Bi:RIG stack and flux concentrators with a conventional MO crystal that has a much lower Verdet constant, such as CdMnTe or TGG. In either case, extending the linear regime involves a tradeoff between sensitivity and linearity, which is a natural mathematical consequence of the Malus curve P(H).

Figure 33:
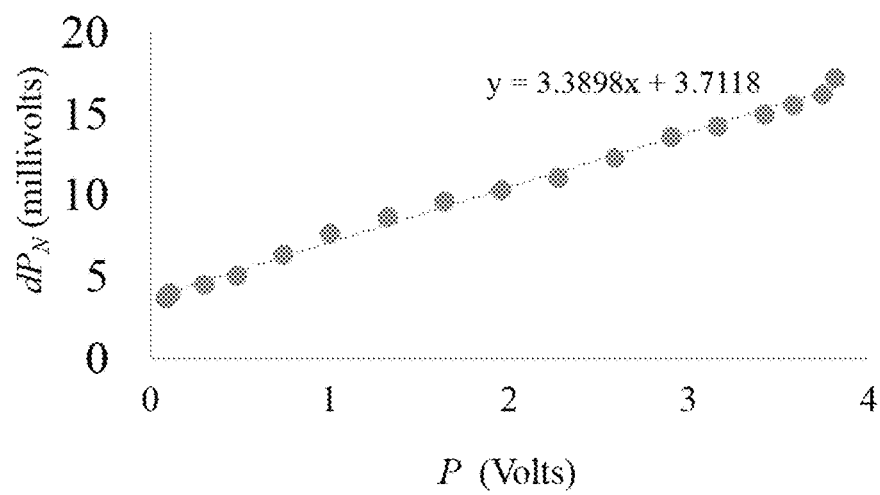
FIG. 33 shows experimental data demonstrating the linear relationship between the MO sensor noise level and the transmitted optical power to the photoreceiver.

The RF modulation signal output from MO sensors depends on the total optical power passing through the crystal, $P_0$. By simply increasing the output power of the laser source, with no other changes, a corresponding (linear) increase would occur in the MO signal voltage. In doing so, however, sensitivity (SNR) will not increase because the Johnson and shot noise produced by the photodetector current/amplifier ($dP_N$) also increases linearly with optical power, as shown in FIG. 33. In order to improve sensitivity with higher optical power, the noise level $dP_N$ must be remain fixed by increasing the analyzer angle $\theta_p$ further towards the extinction point as optical power is increased. This can be seen directly from Equation (13): if $P_0$ increases, the optimal analyzer setting $\theta_p^*$ must be increased.

Figure 35:
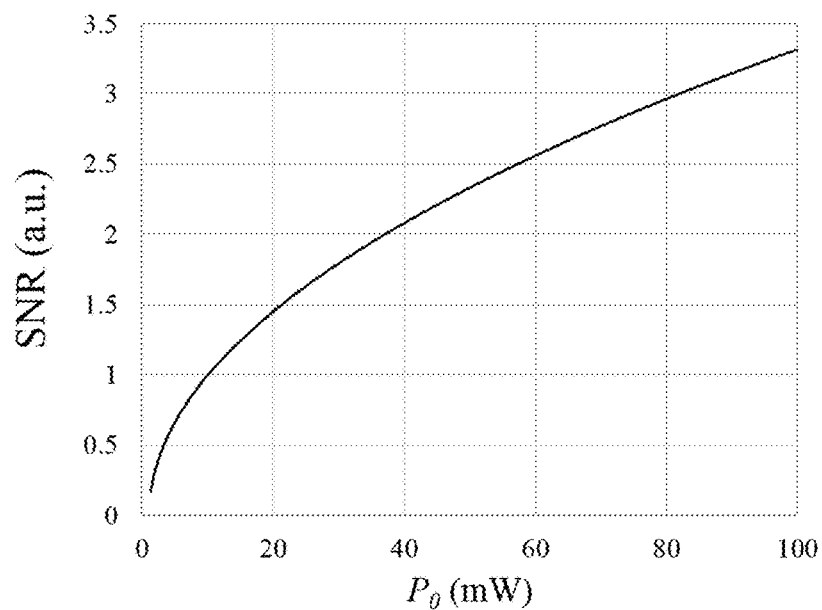
FIG. 35 shows an improvement in the SNR by increasing output optical power of laser source.

If the dc optical power P is held constant while the total optical power $P_0$ is increased, the modulation and SNR will improve in the manner shown in FIG. 35. It can be seen that a ten-fold increase in coupled laser power (i.e. from 10 mW to 100 mW) results in only a three-fold improvement in sensitivity. Since the laser source is the most costly component of the MO sensor, improving sensitivity through increased laser power is not very efficient or lucrative. The square root functional dependence of the SNR in FIG. 35 can be seen from Equation (11), with P being a fixed quantity as $P_0$ is increased.

Commercially available, stabilized, low noise lasers typically have power outputs of about 20 mW. After insertion losses associated with the Bi:RIG transmissivity and the coupling efficiency of the fibers, the effective value of $P_0$ typically becomes about 10 mW. An analyzer position of $\theta_p^*=70°$ will result in a transmitted dc optical power of about 1 mW (since $\cos^2[70°]=0.11$). This dc optical power level is well-suited for many commercial high speed photoreceivers, since they are restricted to dc optical power levels below 1 mW. Therefore, the off-quadrature analyzer position not only optimizes the SNR, but it also lowers the optical power level to match the specifications of the photoreceiver. This is an important feature of the analyzer set-point, since optical attenuators (which waste laser power) are avoided, making the sensor inherently more efficient.

Currently, the smallest magnetic field detected by exemplary MO sensors has been 1.25 pT. The optical modulation associated with this field is a few pW. To detect such small signals, high quality lasers with low ambient noise levels are necessary. Greater SNR's and sensitivities will be achieved in MO sensors powered by such lasers because they reduce the values of $c_0$ and $c_1$ in Equation (8). Since the Bi:RIG MO sensor is best suited for operation at wavelengths commonly utilized by the telecommunication industry (1310 nm-1550 nm), these lasers are of greater availability and of lower cost than those at other wavelengths.

However, even when stabilized lasers and polarization maintaining fibers are used in the MO sensor, noise often still occurs. The noise can be categorized as either amplitude noise (fluctuations in the laser intensity), or phase noise (fluctuations in the polarization state or polarization direction). Anomalous and unpredictable rotations of the laser polarization vector could be particularly troubling, and is one of the major reasons for the presence of the input polarizer 330 in the MO sensor. The input polarizer 330 converts polarization fluctuations into fluctuations in the total optical power ($P_0$), which is easier to deal with. Without the input polarizer 330 present, anomalous rotations will make the value of $\theta_p$ fluctuate and impossible to control, which will directly impact sensitivity (since SNR depends on $\theta_p$) and sensor calibration. With an input polarizer 330 present, $\theta_p$ will be fixed, SNR will remain optimized, and sensor calibration will be straightforward.

According to Equation (9), when $P_0$ undergoes a fluctuation, there will be a corresponding fluctuation in $dP_{MO}$. To the observer, it would be difficult to determine whether the fluctuations in $dP_{MO}$ are due to fluctuations in the external field strength (H) or fluctuations in $P_0$. Directly measuring $P_0$ is not possible, since the analyzer is in a fixed position within the sensor head. A solution to this problem is to measure the DC optical power level (P). In DC coupled photoreceivers, this can be done through the DC voltage level of the MO signal. In AC coupled photoreceivers, this can be done through the DC photodiode current monitor. The ratio of the AC signal component to the DC signal component (defined as the modulation depth m) will yield a quantity that is independent of $P_0$, allowing H to be correctly determined through a fixed calibration factor that does not depend on optical power and is not affected by polarization drifts. The merits of this technique can be demonstrated mathematically. The modulation depth m can be formulated by dividing $dP_{MO}$ in Equation (9) with P in Equation (2). This yields:

$$m = \frac{P_0 \sin(2\theta_p) d\theta_{FR}}{P_0 \cos^2 \theta_p} = 2\tan\theta_p d\theta_{FR} \quad (15)$$

which is independent of $P_0$. Since $\theta_p$ is fixed and $d\theta_{FR}$ is proportional to H, the magnetic field can be extracted from the modulation depth through a fixed calibration factor.

Figure 36:
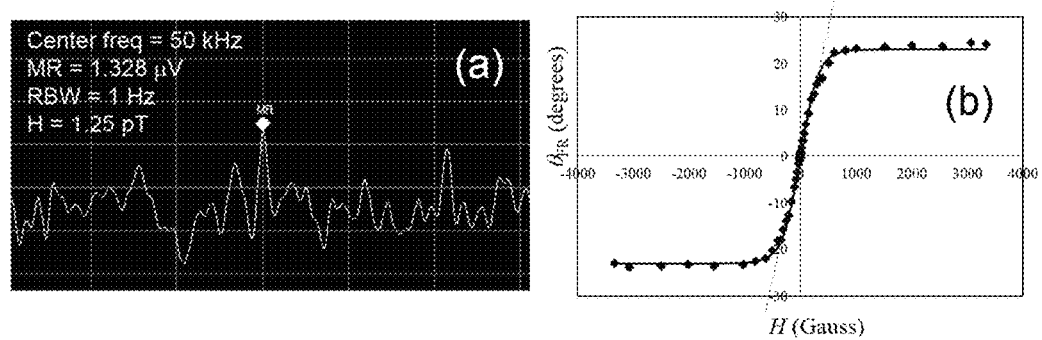
FIG. 36 shows minimum detectable field of 6.39 pT measured by a Bi:RIG sensor using optimal configurations discussed in this disclosure (N=8, contacted IP crystals, FC's). Section (b) shows saturation measurements on a single IP Bi:RIG crystal.
Figure 37:
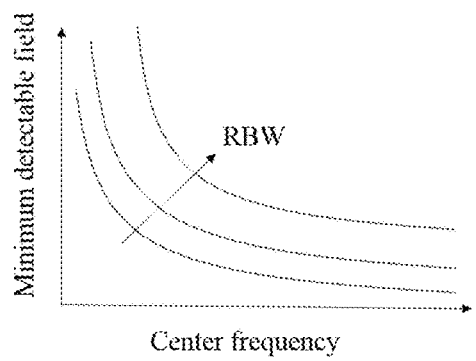
FIG. 37 shows a qualitative illustration of the effect of resolution bandwidth (RBW) and center frequency on the minimum detectable field.

Currently the operating range of exemplary MO sensors covers nine orders of magnitude in magnetic field strength, from $10^{-11}$ T to $10^{-2}$ T. Experimental measurements of the minimum and maximum detectable fields are shown in FIG. 36. The minimum detectable field of 1.25 pT shown in graph (a) of FIG. 36 was obtained on an RF spectrum analyzer using signal averaging and a resolution bandwidth of 1 Hz. This achievement was obtained using the optimal sensor parameters discussed in the present disclosure (IP films, small tilt angles, contacted crystals, flux concentrators). Without signal averaging, the minimum detectable field is about 10 pT. The minimum detectable field is strongly determined by the detailed RF instrumentation and its capacity to measure small signals. The minimum detectable fields also depends inversely on the center frequency and is roughly proportional to the square root of the resolution bandwidth (RBW), as illustrated in FIG. 37.

The maximum detectable field is determined by the saturation field of the Bi:RIG crystals. The data in graph (b) of FIG. 36 begins to deviate from the linear region at about 350 Gauss (0.035 T). Unlike the minimum detectable field, the maximum detectable field is independent of the number of crystals in the stack. However the maximum detectable field is affected by the flux concentrators, which magnify the field strength within the crystal. According to the discussion above, the flux concentrators in the optimal configuration magnify the external field by nearly an order of magnitude. Under these conditions, the maximum detectable field will accordingly be reduced by an order of magnitude, to about 35G ($\sim 10^{-3}$ T). In most applications (for example, fields radiated by RF components), this maximum field is more than adequate, since the magnetic field strengths of interest are many orders of magnitude smaller. However in certain applications, such as the detection of magnetic fields within railguns, fields in excess of several Tesla are measured. Other exemplary MO sensors have been successfully used in such cases. These other exemplary sensors replace the Bi:RIG crystals with an MO crystal of lower sensitivity, such as CdMnTe or TGG. Since the sensor will be used in a low-sensitivity application, the use of flux concentrators is not necessary.

Figure 38:
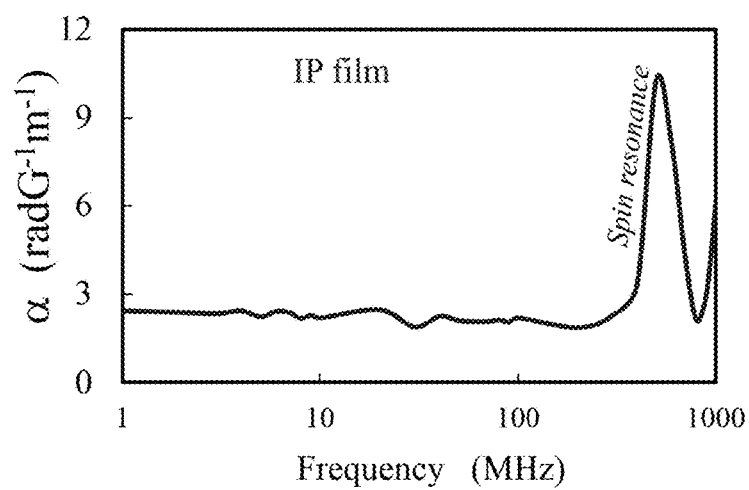
FIG. 38 shows the frequency response of a Bi:RIG sensor with IP films and no FC's.

The frequency response of exemplary MO sensors constructed without flux concentrators is shown in FIG. 38. The sensor exhibits a flat frequency response over 8 decades of frequency, from DC to 500 MHz (where a spin resonance is observed). Beyond the resonance, the sensor continues to measures magnetic fields until the responsivity rolls off at 2 GHz. An important element in achieving the flat response shown in FIG. 38 is the use of Bi:RIG crystals with in-plane anisotropies. The reason for this was discussed above. Extending the bandwidth beyond 2 GHz involves modifications to the Bi:RIG material. Compositional modifications can, in principle, increase both sensitivity and bandwidth. Specifically, in the Bi:RIG chemical formula $(BiGdLu)_3 (Fe_{5-x}Ga_x)O_{12}$, the quantity (x) of Ga dilution in the iron site can be modified to minimize the cubic magneto-crystalline anisotropy $K_1$. This, according to theory, can improve the frequency bandwidth of the material. However such compositional modifications may adversely affect other properties such as the transmissivity and the in-plane anisotropy. Therefore, to address these adverse effects, additional modifications in the Bi doping or in other parameters may be necessary to achieve the desired end result.

The effects of FC's on the MO sensor frequency response was discussed previously. Above 100 MHz, the MO sensor is not affected by the flux concentrators. Therefore, MO sensors with FC's will continue measuring fields up to 2 GHz. However, if a flat frequency response below 100 MHz is required, alternate MO sensors can be constructed without FC's. Such sensors will have lower sensitivity below 100 kHz, compared to their counterparts with FC's. However they will have the flat response shown in FIG. 38.

Figure 39:
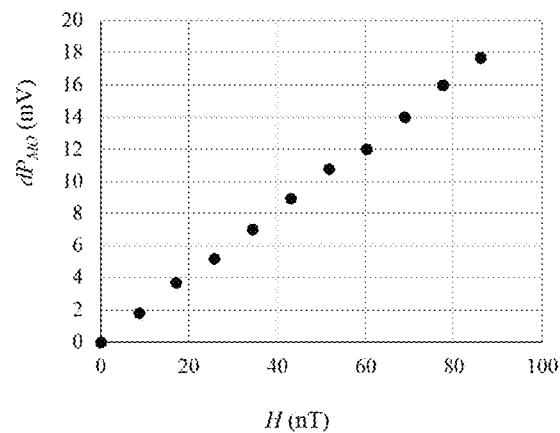
FIG. 39 shows linearity measurements of an exemplary Bi:RIG MO sensor.

An example of the linearity of the MO modulation signal with applied field is shown in FIG. 39. The range of magnetic fields in which such a linear response occurs is extensive and has been discussed in detail above. The fitted slope to the data in FIG. 39 (normalized to the DC level) gives a calibration factor that can be used to convert signal voltage to applied field, as discussed above. The calibration factor will be valid over 7 orders of magnitude of applied field, and 8 orders of magnitude in frequency, if FC's are not used.

Figure 40:
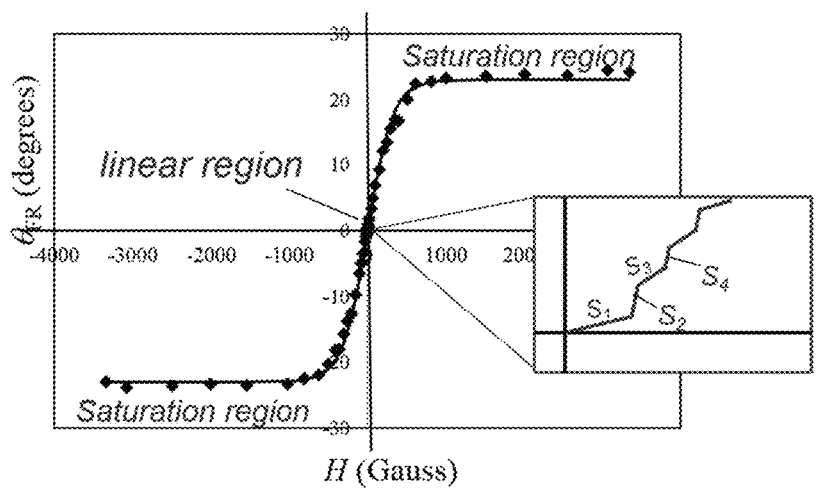
FIG. 40 shows a saturation curve of Bi:RIG film. The inset shows a close up view, making the Barkhausen steps visible.

In MO materials, Faraday rotation increases linearly with $H_{ext}$ until the material is magnetically saturated, as shown in the data of FIG. 40. In sensing applications, MO crystals must be operated within the linear region indicated because this yields a proportional relationship between field strength and signal voltage. The slope of the linear region determines overall sensitivity. It was found, however, that the linear regions in certain compositions of Bi:RIG films are actually comprised of a number of Barkhausen steps, as illustrated in the inset of FIG. 40.

Figure 41:
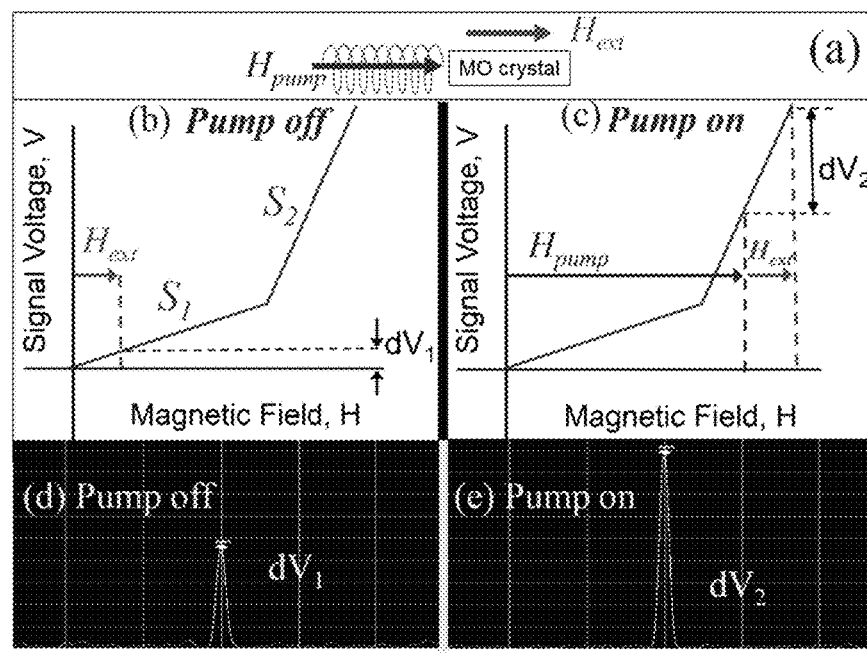
FIG. 41 shows the Barkhausen pumping technique to improve sensitivity: (a) experimental set-up; (b)-(c) An MO signal under an external field $dV_1$ is magnified to a larger value $dV_2$ through the use of a pump field provided by the coil; (d)-(e) experimental proof of concept.

Barkhausen steps are well known features in ferrite magnetization curves, and are due to pinning effects in the domain walls. In Bi:RIG films exhibiting this behavior, the first Barkhausen step is typically observed at field strengths of the order $10^{-4}$ T. Since this threshold is seven orders of magnitude above the minimum detectable field, sensitivity is essentially determined by the initial slope $S_1$ indicated in FIG. 40. However, if the film can be initially biased or "pumped" into a region of higher slope (e.g. $S_2$), sensitivity would be magnified. This principle is illustrated in FIG. 41, where a pump field ($H_{pump}$) provided by a coil is applied to the MO crystal as it is exposed to an external field $H_{ext}$. The initial MO signal voltage ($dV_1$) is magnified substantially due to the larger slope of $S_2$. Portions (d) and (e) of FIG. 41 show preliminary experimental data for this technique, where application of a pump field was found to double the MO signal amplitude. In these tests, it was found that the rise time, amplitude and waveform of the pump field affect the onset and characteristics of the Barkhausen steps, resulting in a large variation in the gain factors (from 0.1 to 5). Gain factors of an order of magnitude or larger should be obtainable when tuned correctly, since slope ratios of this magnitude have been observed in the saturation curves.

Figure 42:
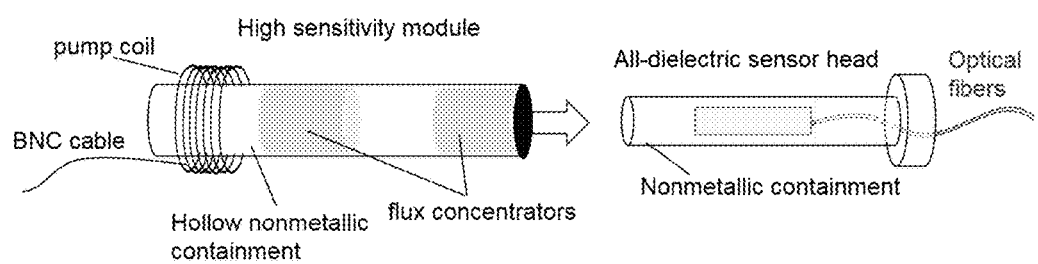
FIG. 42 shows an exemplary sensor with a removable high-sensitivity module.

Since the presence of a pump coil and flux concentrators may interfere with external electromagnetic fields and compromise the benefits of the MO sensor's predominantly all-dielectric structure, exemplary MO sensors may include these components as part of a detachable "high sensitivity module" that is used exclusively for applications in which higher sensitivities are sought, as illustrated in FIG. 42.

There are advantages over conventional (non-MO) magnetic field sensors:
a. B-dot sensors: Since the MO sensor is composed mostly of dielectric material, it is minimally invasive to the external electromagnetic field. B-dot sensors are metallic in structure and will perturb the external field. This is especially problematic in high sensitivity measurements, and measurements inside cavities. B-dot sensors measure the time derivative of fields, rather than the fields themselves. B-dots therefore require additional signal processing to observe the waveform of the external field. MO sensor measure external field waveform directly and instantaneously, without the need for signal processing.
b. Hall probes: The minimum detectable field of exemplary MO sensors is several orders of magnitude lower than the Hall probe. The bandwidth of the MO sensor is six orders of magnitude larger than the Hall Probe. Finally, the Hall probe contains a metallic structure and will perturb fields.
c. Superconducting quantum-interference devices (SQUIDs). Exemplary MO Sensors and RF SQUIDs have similar dynamic ranges and similar bandwidth. While cable of measuring magnetic fields, the RF SQUID is confined to measuring fields of objects placed inside of it. It cannot be used, for example, to probe regions inside cavities, or to make spatial profile measurements. The RF SQUID is also comprised of metallic parts which perturb electromagnetic fields, and must be operated at cryogenic temperatures. The MO sensor avoids all of these difficulties by being compact, portable, minimally intrusive, and operates at room temperatures.
d. Atomic Vapor Cells share similar difficulties with RF SQUIDs, as they have temperature restrictions, metallic parts, and probing difficulties. While atomic vapor cells have sensitivities superior to RF SQUIDs and MO sensors, their bandwidths are restricted to the kHz ranges, making them unusable for many RF applications. MO sensors do not have these difficulties, since they operate at room temperature, are minimally invasive, compact, portable, and have bandwidths of 2 GHz.

MO sensors produced by other groups have reported minimum detectable fields of $10^{-6}$ T using a 1 Hz measurement bandwidth. In exemplary embodiments, minimum detectable fields of $1.25\times10^{-12}$ T using a 1 Hz measurement bandwidth are possible—a sensitivity improvement of six orders of magnitude.

Although the invention has been shown and described with respect to a certain embodiment or embodiments, it is obvious that equivalent alterations and modifications will occur to others skilled in the art upon the reading and understanding of this specification and the annexed drawings. In particular regard to the various functions performed by the above described elements (components, assemblies, devices, compositions, etc.), the terms (including a reference to a "means") used to describe such elements are intended to correspond, unless otherwise indicated, to any element which performs the specified function of the described element (i.e., that is functionally equivalent), even though not structurally equivalent to the disclosed structure which performs the function in the herein illustrated exemplary embodiment or embodiments of the invention. In addition, while a particular feature of the invention may have been described above with respect to only one or more of several illustrated embodiments, such feature may be combined with one or more other features of the other embodiments, as may be desired and advantageous for any given or particular application.

What is claimed is:
1. An ultra-sensitivity optical-fiber magneto-optic field sensor comprising:
an input fiber passing optical power from an optical source into the sensor;
a polarizer optically coupled to and downstream of the input fiber;
an analyzer optically coupled to and downstream of the polarizer;
an output fiber passing optical power out of the sensor to a photoreceiver;
a first magneto-optic crystal element optically coupled between the polarizer and the analyzer;
a second magneto-optic crystal element optically coupled between the first magneto-optic crystal element and the analyzer;
a first flux concentrator optically coupled to and between the polarizer and the first magneto-optic crystal element;
a second flux concentrator optically coupled to and between the second magneto-optic crystal element and the analyzer; and
a third flux concentrator optically coupled to and between the first and second magneto-optic crystal elements,
wherein the ultra-sensitivity optical-fiber magneto-optic field sensor has an optical axis extending between the input and output fibers along which a beam of optical power is transmitted, and
wherein the magneto-optic crystal element is a stack of crystals having a planar anisotropy.
2. The ultra-sensitivity optical-fiber magneto-optic field sensor of claim 1, wherein an angular orientation of the analyzer about the optical axis is rotated with respect to the polarizer at an angle of between 70° and 80°.

3. An ultra-sensitivity optical-fiber magneto-optic field sensor comprising:
- an input fiber passing optical power from an optical source into the sensor;
- a polarizer optically coupled to and downstream of the input fiber;
- an analyzer optically coupled to and downstream of the polarizer;
- an output fiber passing optical power out of the sensor to a photoreceiver; and
- a magneto-optic crystal element optically coupled between the polarizer and the analyzer;
- wherein the ultra-sensitivity optical-fiber magneto-optic field sensor has an optical axis extending between the input and output fibers along which a beam of optical power is transmitted, and
- wherein an angular orientation of the analyzer about the optical axis is rotated with respect to the polarizer at an angle $\theta_p^*$, wherein $$\theta_p^* = \cos^{-1}\sqrt{1/(2+P_0 c_1/c_0)},$$

and wherein $P_0$ is the optical power passing through the magneto-optic crystal element, and wherein $c_0$ and $c_1$ are constants that depend on the noise characteristics of the photoreceiver and source of the optical power.

4. The ultra-sensitivity optical-fiber magneto-optic field sensor of claim 3, further comprising:
- a first flux concentrator optically coupled to and between the polarizer and the magneto-optic crystal element; and
- a second flux concentrator optically coupled to and between the magneto-optic crystal element and the analyzer.

5. The ultra-sensitivity optical-fiber magneto-optic field sensor of claim 4, wherein the flux concentrators are hollow cylindrical tubes having a ratio of length to minimum diameter of about 40:1.

6. The ultra-sensitivity optical-fiber magneto-optic field sensor of claim 4, wherein the flux concentrators are hollow conical tubes.

7. The ultra-sensitivity optical-fiber magneto-optic field sensor of claim 4, wherein each flux concentrator is placed in contact with respective ends of the magneto-optic crystal element.

8. The ultra-sensitivity optical-fiber magneto-optic field sensor of claim 3, wherein the magneto-optic crystal element is a stack of crystals and the stack of crystals has a tilt angle of between 1 and 5 degrees from being perpendicular to the optical axis.

9. The ultra-sensitivity optical-fiber magneto-optic field sensor of claim 3, further comprising:
- a first flux concentrator optically coupled to and between the polarizer and the magneto-optic crystal element, and having an end formed at a tilt angle matching the tilt angle of the magneto-optic crystal element, and wherein the end of the first flux concentrator is in physical contact with an adjacent end of the magneto-optic crystal element; and
- a second flux concentrator optically coupled to and between the magneto-optic crystal element and the analyzer, and having an end formed at a tilt angle matching the tilt angle of the magneto-optic crystal element, and wherein the end of the second flux concentrator is in physical contact with an adjacent end of the magneto-optic crystal element.

10. The ultra-sensitivity optical-fiber magneto-optic field sensor of claim 3, wherein the magneto-optic crystal element is a stack of crystals and wherein each crystal in the stack of crystals are in physical contact with any adjacent crystals, and wherein each crystal in the stack of crystals contains matching domain patterns with each adjacent crystal.

11. The ultra-sensitivity optical-fiber magneto-optic field sensor of claim 10, wherein each crystal in the stack of crystals is coated with anti-reflective coating.

12. The ultra-sensitivity optical-fiber magneto-optic field sensor of claim 3, further comprising a collimating lens optically coupled between the input fiber and the polarizer.

13. The ultra-sensitivity optical-fiber magneto-optic field sensor of claim 3, wherein the input fiber is a polarization maintaining fiber.

14. The ultra-sensitivity optical-fiber magneto-optic field sensor of claim 3, wherein the output fiber is a multimode fiber.

15. The ultra-sensitivity optical-fiber magneto-optic field sensor of claim 3, wherein the transmission axis of the polarizer is aligned with the direction of laser polarization exiting the input fiber.

16. An ultra-sensitivity optical-fiber magneto-optic field sensor comprising:
- an input fiber passing optical power from an optical source into the sensor;
- a polarizer optically coupled to and downstream of the input fiber;
- an analyzer optically coupled to and downstream of the polarizer;
- an output fiber passing optical power out of the sensor to a photoreceiver;
- a magneto-optic crystal element optically coupled between the polarizer and the analyzer;
- a pump coil configured to selectively prime the crystal element into operating at a Barkhausen step of higher slope relative to an unprimed state of the crystal element; and
- a removable high sensitivity module having the pump coil,
- wherein the ultra-sensitivity optical-fiber magneto-optic field sensor has an optical axis extending between the input and output fibers along which a beam of optical power is transmitted, and
- wherein the magneto-optic crystal element is a stack of crystals having a planar anisotropy.

17. The ultra-sensitivity optical-fiber magneto-optic field sensor of claim 16, wherein the removable high sensitivity module includes flux concentrators.

* * * * *